(12) United States Patent
Tham et al.

(10) Patent No.: US 9,151,175 B2
(45) Date of Patent: Oct. 6, 2015

(54) TURBINE ABRADABLE LAYER WITH PROGRESSIVE WEAR ZONE MULTI LEVEL RIDGE ARRAYS

(71) Applicant: Siemens Aktiengesellschaft, München (DE)

(72) Inventors: Kok-Mun Tham, Oviedo, FL (US); Vincent P. Laurello, Hobe Sound, FL (US); Ching-Pang Lee, Cincinnati, OH (US); Gm Salam Azad, Oviedo, FL (US); Nicholas F. Martin, Jr., York, SC (US); David G. Sansom, Lake Wyle, SC (US); Neil Hitchman, Charlotte, NC (US)

(73) Assignee: SIEMENS AKTIENGESELLSCHAFT, München (DE)

( * ) Notice: Subject to any disclaimer, the term of this patent is extended or adjusted under 35 U.S.C. 154(b) by 0 days.

(21) Appl. No.: 14/188,958

(22) Filed: Feb. 25, 2014

(65) Prior Publication Data

US 2015/0240651 A1     Aug. 27, 2015

(51) Int. Cl.
*F01D 11/12* (2006.01)

(52) U.S. Cl.
CPC .......... *F01D 11/122* (2013.01); *F05D 2230/31* (2013.01); *F05D 2250/28* (2013.01); *F05D 2300/611* (2013.01)

(58) Field of Classification Search
CPC .................................................... F01D 11/122
See application file for complete search history.

(56) References Cited

U.S. PATENT DOCUMENTS

| 1,061,206 | A | 5/1913 | Tesla |
|---|---|---|---|
| 3,867,061 | A | 2/1975 | Moskowitz |
| 3,970,319 | A | 7/1976 | Carroll et al. |
| 4,028,523 | A | 6/1977 | Anderl et al. |
| 4,152,223 | A | 5/1979 | Wallace et al. |
| 4,289,447 | A | 9/1981 | Sterman et al. |
| 4,303,693 | A | 12/1981 | Driver |
| 4,321,310 | A | 3/1982 | Ulion et al. |
| 4,335,190 | A | 6/1982 | Bill et al. |
| 4,405,284 | A | 9/1983 | Albrecht et al. |
| 4,414,249 | A | 11/1983 | Ulion et al. |
| 4,466,772 | A | 8/1984 | Okapuu et al. |
| 4,514,469 | A | 4/1985 | Loersch et al. |
| 4,526,509 | A | 7/1985 | Gay, Jr. et al. |

(Continued)

FOREIGN PATENT DOCUMENTS

| DE | 2612210 | 9/1977 |
|---|---|---|
| DE | 4238369 | 5/1994 |

(Continued)

*Primary Examiner* — Nathaniel Wiehe
*Assistant Examiner* — Jeffrey A Brownson

(57) ABSTRACT

Turbine and compressor casing abradable component embodiments for turbine engines, with composite grooves and vertically projecting alternating rows of first and second height ridges in planform patterns, to reduce, redirect and/or block blade tip airflow leakage downstream into the grooves rather than from turbine blade airfoil high to low pressure sides. The first ridges have a first ridge height greater than that of the second ridges. These ridge or rib embodiments have first lower and second upper wear zones. The lower zone, at and below the second ridge height, optimizes engine airflow characteristics, while the upper zone, between tips of the second and first ridges, is optimized to minimize blade tip gap and wear by being more easily abradable than the lower zone.

19 Claims, 18 Drawing Sheets

(56) References Cited

U.S. PATENT DOCUMENTS

| | | |
|---|---|---|
| 4,594,053 A | 6/1986 | Sohngen |
| 4,714,406 A | 12/1987 | Hough |
| 4,764,089 A | 8/1988 | Strangman |
| 4,810,334 A | 3/1989 | Honey et al. |
| 4,885,213 A | 12/1989 | Miyamoto et al. |
| 5,057,379 A | 10/1991 | Fayeulle et al. |
| 5,064,727 A | 11/1991 | Naik et al. |
| 5,124,006 A | 6/1992 | Fayeulle et al. |
| 5,167,721 A | 12/1992 | McComas et al. |
| 5,236,745 A | 8/1993 | Gupta et al. |
| 5,352,540 A | 10/1994 | Schienle et al. |
| 5,403,669 A | 4/1995 | Gupta et al. |
| 5,435,889 A | 7/1995 | Dietrich |
| 5,514,445 A | 5/1996 | Delage et al. |
| 5,534,308 A | 7/1996 | Bamberg et al. |
| 5,579,534 A | 11/1996 | Itoh et al. |
| 5,645,893 A | 7/1997 | Rickerby et al. |
| 5,681,616 A | 10/1997 | Gupta et al. |
| 5,716,720 A | 2/1998 | Murphy |
| 5,721,057 A | 2/1998 | Bamberg et al. |
| 5,723,078 A | 3/1998 | Nagaraj et al. |
| 5,817,371 A | 10/1998 | Gupta et al. |
| 5,817,372 A | 10/1998 | Zheng |
| 5,866,271 A | 2/1999 | Stueber et al. |
| 5,894,053 A | 4/1999 | Fried |
| 5,900,283 A | 5/1999 | Vakil et al. |
| 5,951,892 A | 9/1999 | Wolfla et al. |
| 5,952,110 A | 9/1999 | Schell et al. |
| 6,074,706 A | 6/2000 | Beverley et al. |
| 6,096,381 A | 8/2000 | Zheng |
| 6,102,656 A | 8/2000 | Nissley et al. |
| 6,106,959 A | 8/2000 | Vance et al. |
| 6,136,453 A | 10/2000 | Ritter et al. |
| 6,155,778 A | 12/2000 | Lee et al. |
| 6,159,553 A | 12/2000 | Li et al. |
| 6,165,628 A | 12/2000 | Borom et al. |
| 6,171,351 B1 | 1/2001 | Schroder et al. |
| 6,203,021 B1 | 3/2001 | Wolfla et al. |
| 6,224,963 B1 | 5/2001 | Strangman |
| 6,231,998 B1 | 5/2001 | Bowker et al. |
| 6,235,370 B1 | 5/2001 | Merrill et al. |
| 6,242,050 B1 | 6/2001 | Ritter et al. |
| 6,251,526 B1 | 6/2001 | Staub |
| 6,264,766 B1 | 7/2001 | Ritter et al. |
| 6,274,201 B1 | 8/2001 | Borom et al. |
| 6,316,078 B1 | 11/2001 | Smialek |
| 6,361,878 B2 | 3/2002 | Ritter et al. |
| 6,368,727 B1 | 4/2002 | Ritter et al. |
| 6,387,527 B1 | 5/2002 | Hasz et al. |
| 6,440,575 B1 | 8/2002 | Heimberg et al. |
| 6,444,331 B2 | 9/2002 | Ritter et al. |
| 6,457,939 B2 | 10/2002 | Ghasripoor et al. |
| 6,471,881 B1 | 10/2002 | Chai et al. |
| 6,482,469 B1 | 11/2002 | Spitsberg et al. |
| 6,485,845 B1 | 11/2002 | Wustman et al. |
| 6,503,574 B1 | 1/2003 | Skelly et al. |
| 6,527,509 B2 | 3/2003 | Kurokawa et al. |
| 6,541,075 B2 | 4/2003 | Hasz et al. |
| 6,582,189 B2 | 6/2003 | Irie et al. |
| 6,607,789 B1 | 8/2003 | Rigney et al. |
| 6,637,643 B2 | 10/2003 | Hasz et al. |
| 6,641,907 B1 | 11/2003 | Merrill et al. |
| 6,652,227 B2 | 11/2003 | Fried |
| 6,716,539 B2 | 4/2004 | Subramanian |
| 6,720,087 B2 | 4/2004 | Fried et al. |
| 6,764,771 B1 | 7/2004 | Heimberg et al. |
| 6,812,471 B2 | 11/2004 | Popiolkowski et al. |
| 6,821,578 B2 | 11/2004 | Beele |
| 6,830,428 B2 | 12/2004 | Le Biez et al. |
| 6,846,574 B2 | 1/2005 | Subramanian |
| 6,881,029 B2 | 4/2005 | Le Biez et al. |
| 6,887,528 B2 | 5/2005 | Lau et al. |
| 6,887,595 B1 | 5/2005 | Darolia et al. |
| 6,905,305 B2 | 6/2005 | James |
| 7,029,232 B2 | 4/2006 | Tuffs et al. |
| 7,029,721 B2 | 4/2006 | Hasz et al. |
| 7,150,921 B2 | 12/2006 | Nelson et al. |
| 7,172,820 B2 | 2/2007 | Darolia et al. |
| 7,182,580 B2 | 2/2007 | Bostanjoglo et al. |
| 7,182,581 B2 | 2/2007 | Bostanjoglo et al. |
| 7,210,905 B2 | 5/2007 | Lapworth |
| 7,220,458 B2 | 5/2007 | Hollis et al. |
| 7,250,222 B2 | 7/2007 | Halberstadt et al. |
| 7,338,250 B2 | 3/2008 | Martindale et al. |
| 7,338,719 B2 | 3/2008 | Quadakkers et al. |
| 7,378,132 B2 | 5/2008 | Renteria et al. |
| 7,462,378 B2 | 12/2008 | Nowak et al. |
| 7,479,328 B2 | 1/2009 | Roth-Fagaraseanu et al. |
| 7,507,484 B2 | 3/2009 | Kulkarni et al. |
| 7,509,735 B2 | 3/2009 | Philip et al. |
| 7,510,743 B2 | 3/2009 | Subramanian |
| 7,600,968 B2 | 10/2009 | Nelson et al. |
| 7,614,847 B2 | 11/2009 | Nelson et al. |
| 7,686,570 B2 | 3/2010 | Allen |
| 7,723,249 B2 | 5/2010 | Doesburg et al. |
| 7,736,704 B2 | 6/2010 | Chandra et al. |
| 7,819,625 B2 | 10/2010 | Merrill et al. |
| 7,871,244 B2 | 1/2011 | Marini et al. |
| 7,935,413 B2 | 5/2011 | Stamm |
| 7,955,708 B2 | 6/2011 | Doesburg et al. |
| 7,968,144 B2 | 6/2011 | James et al. |
| 8,007,246 B2 | 8/2011 | Rowe et al. |
| 8,021,742 B2 | 9/2011 | Anoshkina et al. |
| 8,061,978 B2 | 11/2011 | Tholen et al. |
| 8,061,979 B1 | 11/2011 | Liang |
| 8,079,806 B2 | 12/2011 | Tholen et al. |
| 8,100,629 B2 | 1/2012 | Lebret |
| 8,123,466 B2 | 2/2012 | Pietraszkiewicz et al. |
| 8,124,252 B2 | 2/2012 | Cybulsky et al. |
| 8,137,820 B2 | 3/2012 | Fairbourn |
| 8,177,494 B2 | 5/2012 | Ward et al. |
| 8,209,831 B2 | 7/2012 | Boehm et al. |
| 8,303,247 B2 | 11/2012 | Schlichting et al. |
| 8,376,697 B2 | 2/2013 | Wiebe et al. |
| 8,388,309 B2 | 3/2013 | Marra et al. |
| 8,453,327 B2 | 6/2013 | Allen |
| 8,506,243 B2 | 8/2013 | Strock et al. |
| 8,511,993 B2 | 8/2013 | Kemppainen et al. |
| 8,535,783 B2 | 9/2013 | Lutjen et al. |
| 8,586,172 B2 | 11/2013 | Rosenzweig et al. |
| 8,770,926 B2 | 7/2014 | Guo et al. |
| 8,939,716 B1 | 1/2015 | Lee et al. |
| 2003/0039764 A1 | 2/2003 | Burns et al. |
| 2003/0054108 A1 | 3/2003 | Beele |
| 2003/0101587 A1 | 6/2003 | Rigney et al. |
| 2003/0175116 A1 | 9/2003 | Le Biez et al. |
| 2004/0256504 A1 | 12/2004 | Segrest et al. |
| 2004/0265120 A1 | 12/2004 | Tuffs et al. |
| 2005/0003172 A1 | 1/2005 | Wheeler et al. |
| 2005/0036892 A1 | 2/2005 | Bajan |
| 2005/0164027 A1 | 7/2005 | Lau et al. |
| 2005/0178126 A1 | 8/2005 | Young et al. |
| 2005/0228098 A1 | 10/2005 | Skoog et al. |
| 2005/0249602 A1 | 11/2005 | Freling et al. |
| 2005/0260434 A1 | 11/2005 | Nelson et al. |
| 2005/0266163 A1 | 12/2005 | Wortman et al. |
| 2006/0105182 A1 | 5/2006 | Brueckner et al. |
| 2006/0110248 A1 | 5/2006 | Nelson et al. |
| 2007/0110900 A1 | 5/2007 | Nowak et al. |
| 2007/0160859 A1 | 7/2007 | Darolia et al. |
| 2007/0178247 A1 | 8/2007 | Bucci et al. |
| 2008/0044273 A1 | 2/2008 | Khalid |
| 2008/0057214 A1 | 3/2008 | Fagoaga Altuna et al. |
| 2008/0145643 A1 | 6/2008 | Reynolds et al. |
| 2008/0145694 A1 | 6/2008 | Bucci |
| 2008/0206542 A1 | 8/2008 | Vance et al. |
| 2008/0260523 A1 | 10/2008 | Alvanos et al. |
| 2008/0274336 A1 | 11/2008 | Merrill et al. |
| 2009/0162670 A1 | 6/2009 | Lau et al. |
| 2009/0311416 A1 | 12/2009 | Nelson et al. |
| 2009/0324401 A1 | 12/2009 | Calla |
| 2010/0003894 A1 | 1/2010 | Miller et al. |
| 2010/0104773 A1 | 4/2010 | Neal et al. |
| 2010/0136254 A1 | 6/2010 | Darolia et al. |

(56) References Cited

U.S. PATENT DOCUMENTS

| | | | |
|---|---|---|---|
| 2011/0003119 A1 | 1/2011 | Doesburg et al. | |
| 2011/0014060 A1 | 1/2011 | Bolcavage et al. | |
| 2011/0044821 A1 | 2/2011 | Rowe et al. | |
| 2011/0048017 A1 | 3/2011 | Margolies et al. | |
| 2011/0076413 A1 | 3/2011 | Margolies et al. | |
| 2011/0097538 A1 | 4/2011 | Bolcavage et al. | |
| 2011/0116920 A1 | 5/2011 | Strock et al. | |
| 2011/0143163 A1 | 6/2011 | Halberstadt et al. | |
| 2011/0151219 A1 | 6/2011 | Nagaraj et al. | |
| 2011/0182720 A1 | 7/2011 | Kojima et al. | |
| 2012/0063881 A1 | 3/2012 | Tallman | |
| 2012/0107103 A1 | 5/2012 | Kojima et al. | |
| 2012/0272653 A1 | 11/2012 | Merrill et al. | |
| 2012/0275908 A1 | 11/2012 | Guo et al. | |
| 2012/0295061 A1 | 11/2012 | Bunker et al. | |
| 2013/0004305 A1 | 1/2013 | Giovannetti et al. | |
| 2013/0017072 A1 | 1/2013 | Ali et al. | |
| 2013/0034661 A1 | 2/2013 | Schneiderbanger et al. | |
| 2013/0052415 A1 | 2/2013 | Burns et al. | |
| 2013/0122259 A1 | 5/2013 | Lee | |
| 2013/0186304 A1 | 7/2013 | Pabla et al. | |
| 2013/0189085 A1 | 7/2013 | Werner et al. | |
| 2013/0189441 A1 | 7/2013 | Pabla et al. | |
| 2014/0127005 A1 | 5/2014 | Schreiber | |

FOREIGN PATENT DOCUMENTS

| | | |
|---|---|---|
| DE | 10057187 | 5/2002 |
| DE | 10117127 | 10/2002 |
| DE | 10124398 | 11/2002 |
| DE | 10241741 | 3/2004 |
| DE | 10357180 | 6/2005 |
| DE | 10200505873 | 4/2007 |
| DE | 102009011913 | 9/2010 |
| DE | 102011004503 | 8/2012 |
| DE | 102011077620 | 12/2012 |
| EP | 0816526 | 1/1998 |
| EP | 1217089 | 6/2002 |
| EP | 1260608 | 11/2002 |
| EP | 1304395 | 4/2003 |
| EP | 0944767 | 4/2004 |
| EP | 1491657 | 12/2004 |
| EP | 1491658 | 12/2004 |
| EP | 1522604 | 4/2005 |
| EP | 2140973 | 6/2010 |
| EP | 2202328 | 6/2010 |
| EP | 2434102 | 3/2012 |
| EP | 2589872 | 5/2013 |
| GB | 2222179 | 2/1990 |
| WO | 9943861 | 9/1999 |
| WO | 2005038074 | 4/2005 |
| WO | 2012160586 | 11/2012 |

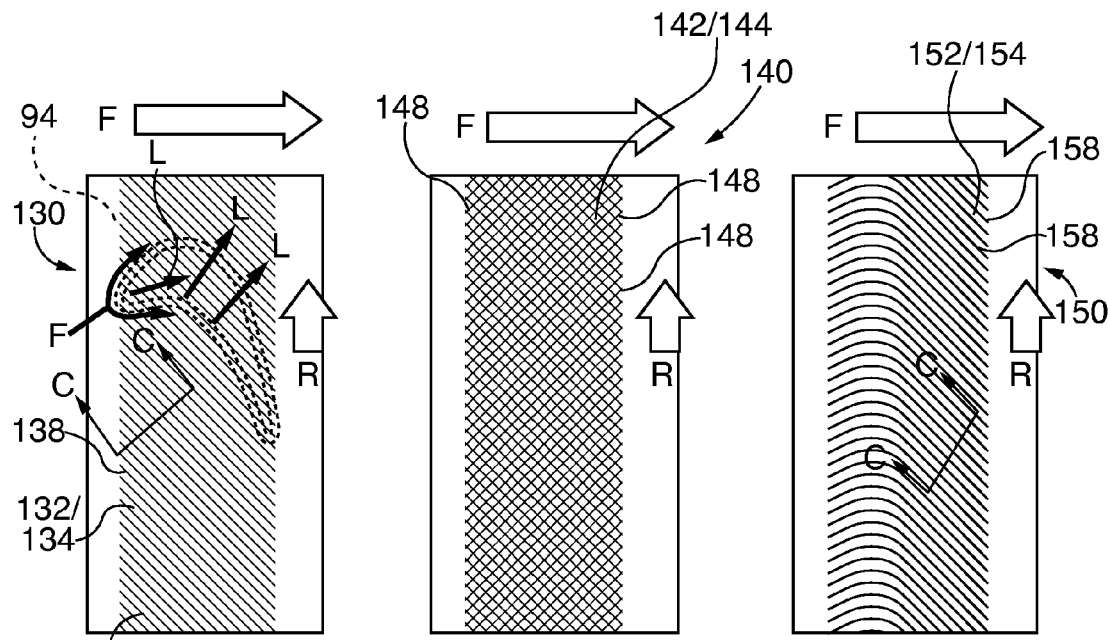
FIG. 7 PRIOR ART
FIG. 8 PRIOR ART
FIG. 9 PRIOR ART
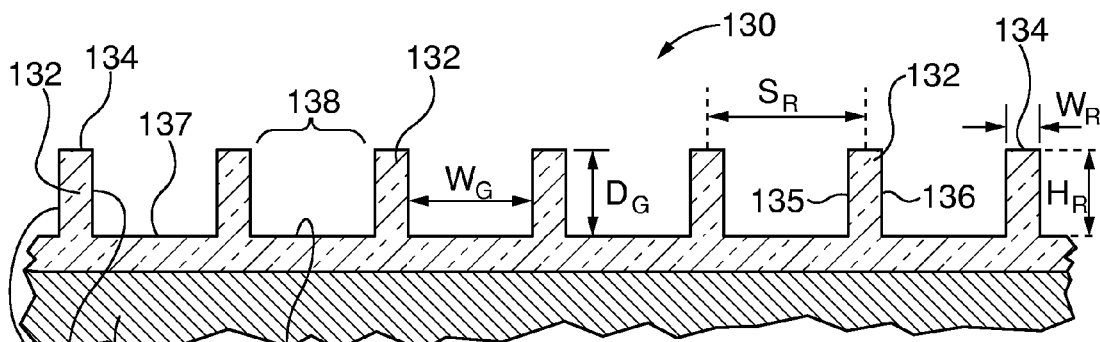
FIG. 10 PRIOR ART
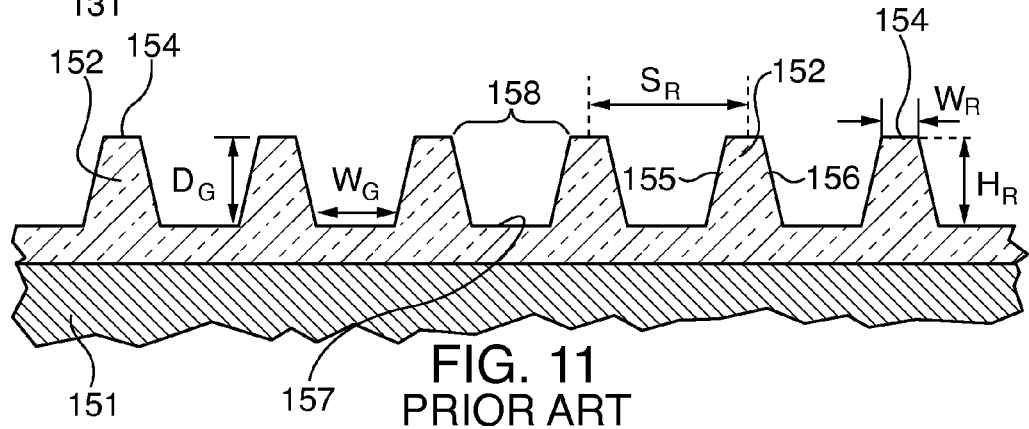
FIG. 11 PRIOR ART

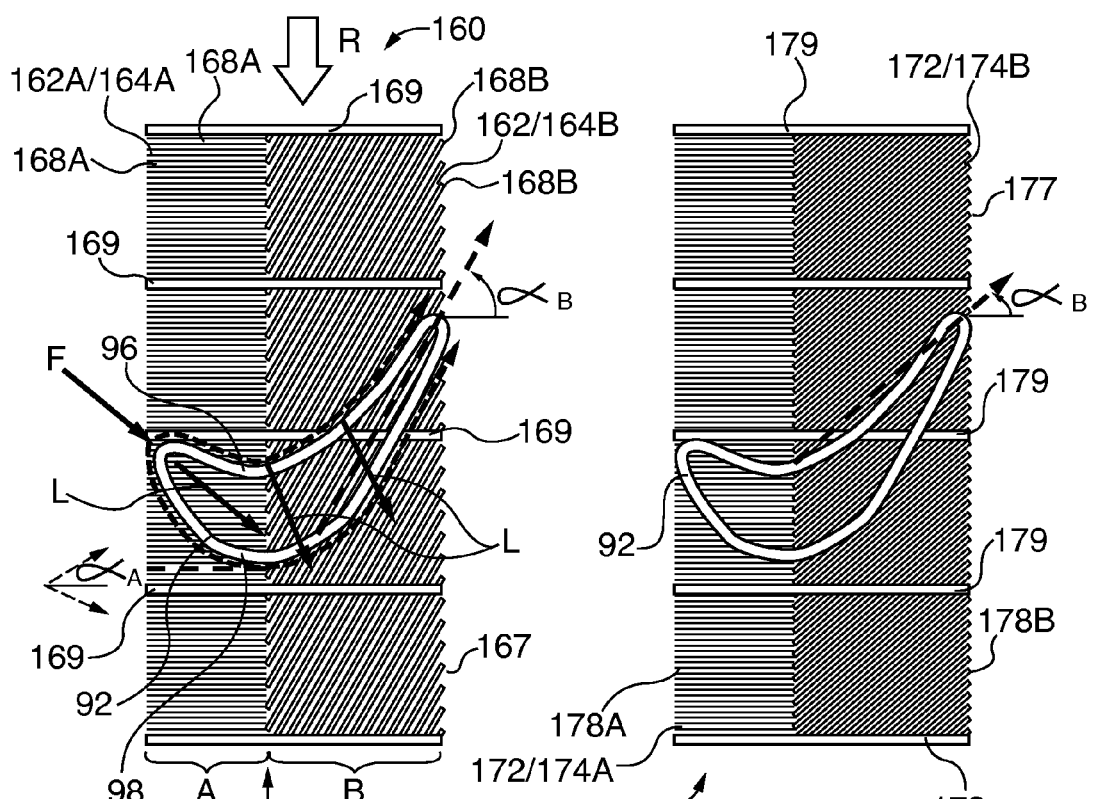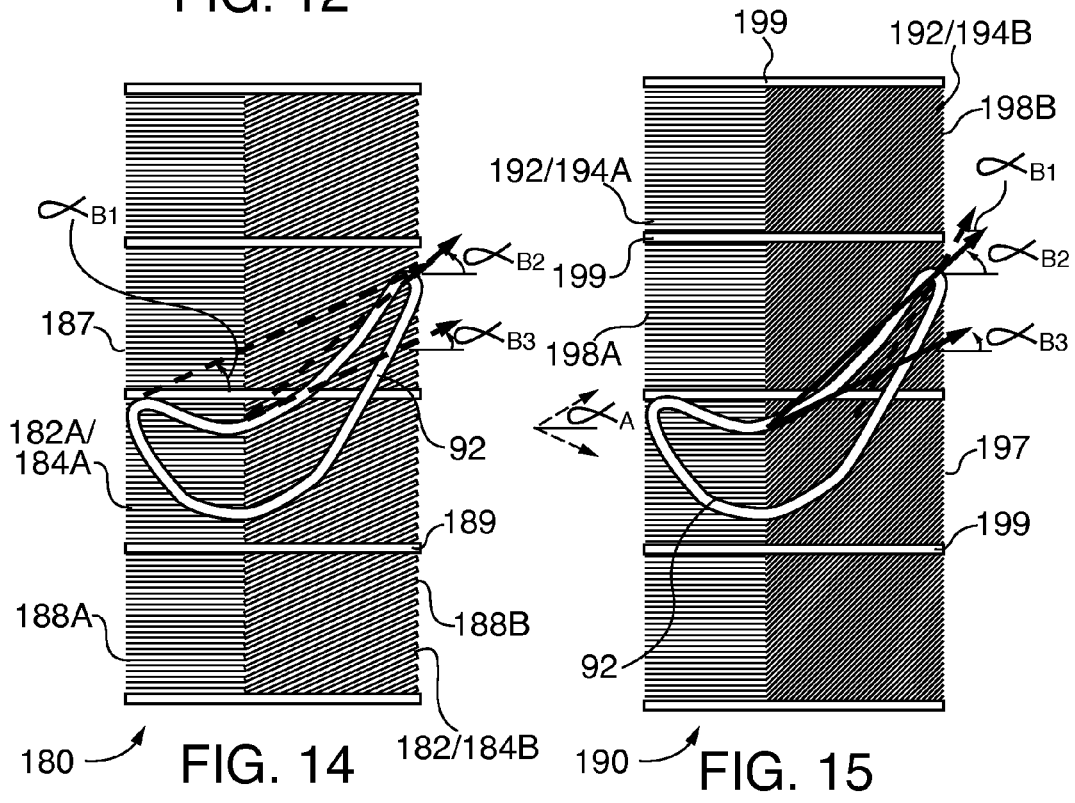

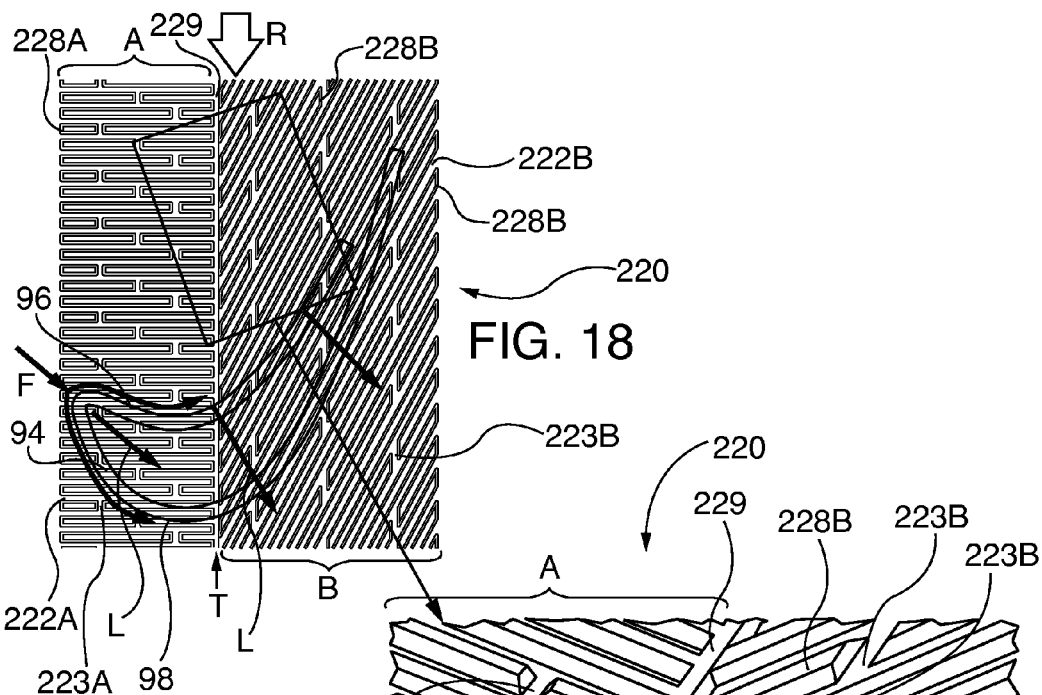
FIG. 18
FIG. 19
PS Tip Rail Leakage Mass Flux
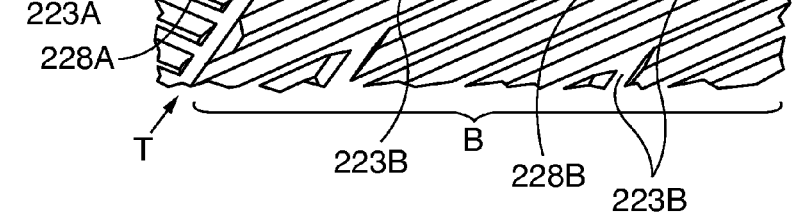
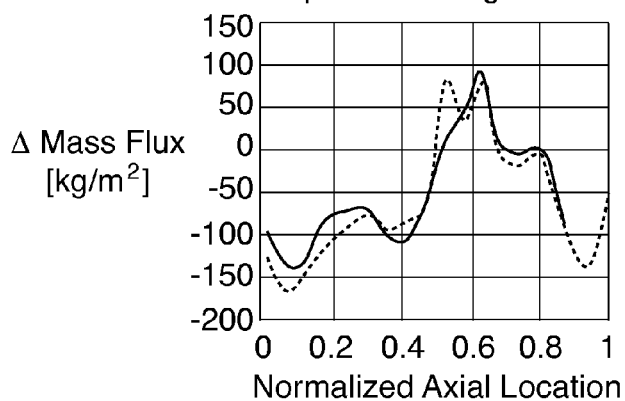
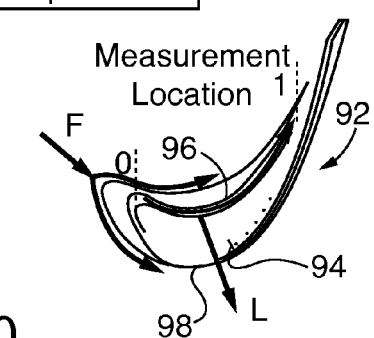
FIG. 20

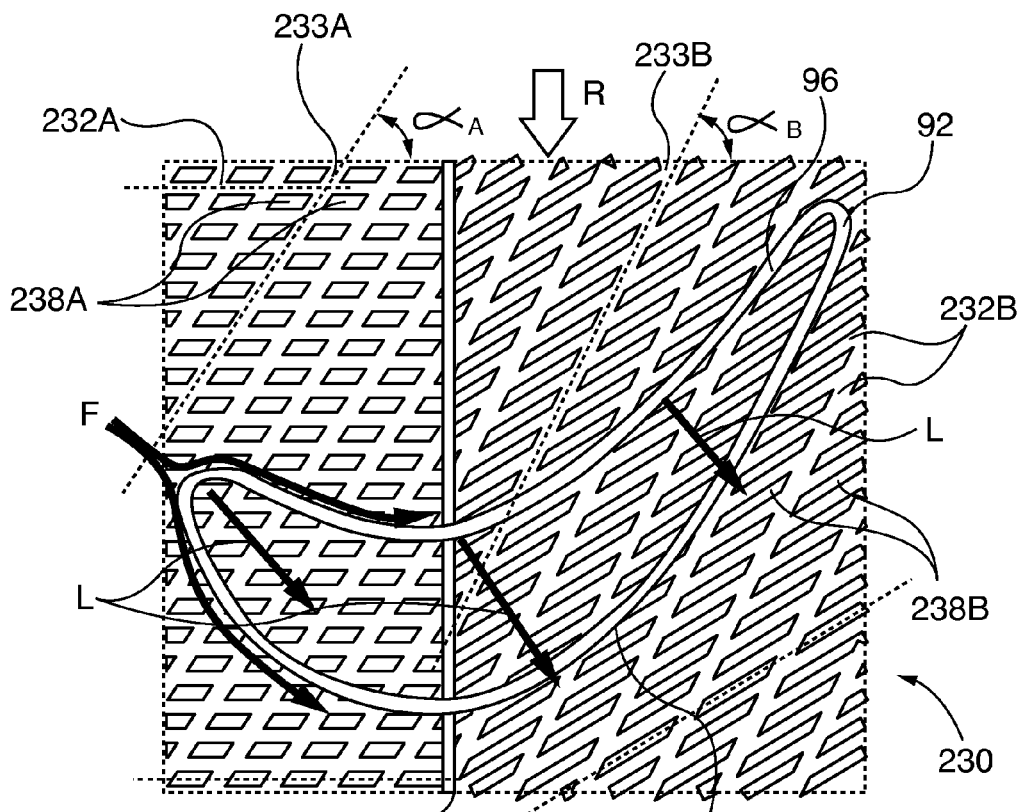
FIG. 21
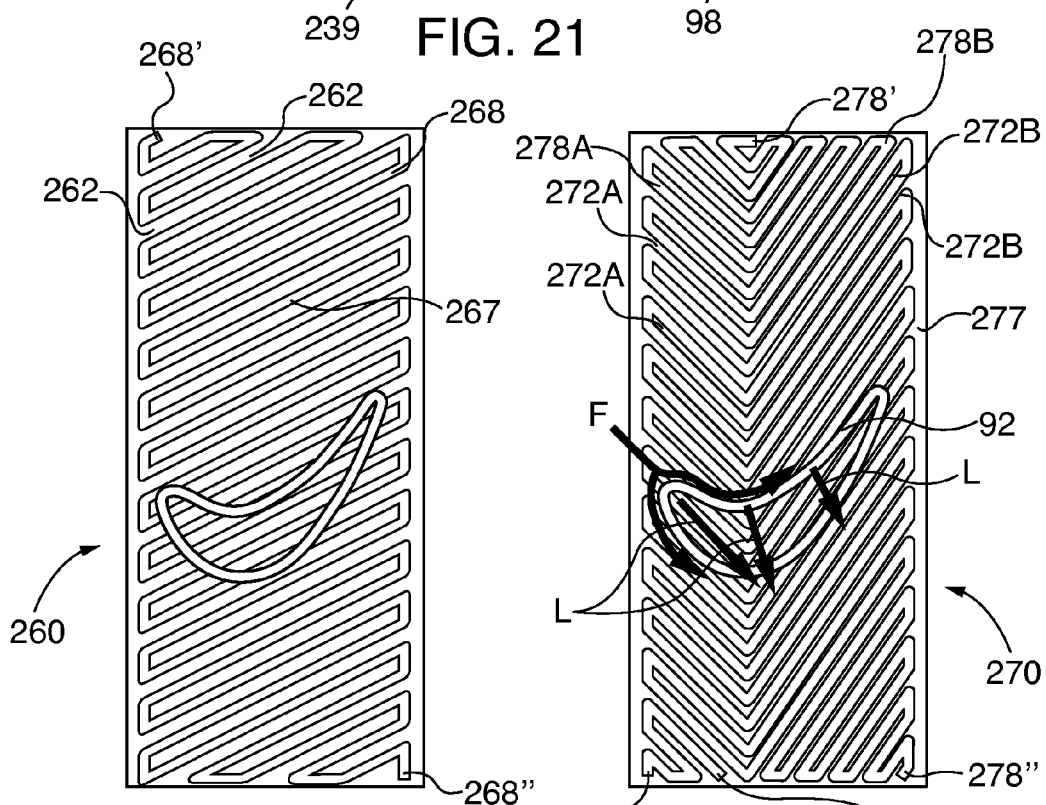
FIG. 24
FIG. 25

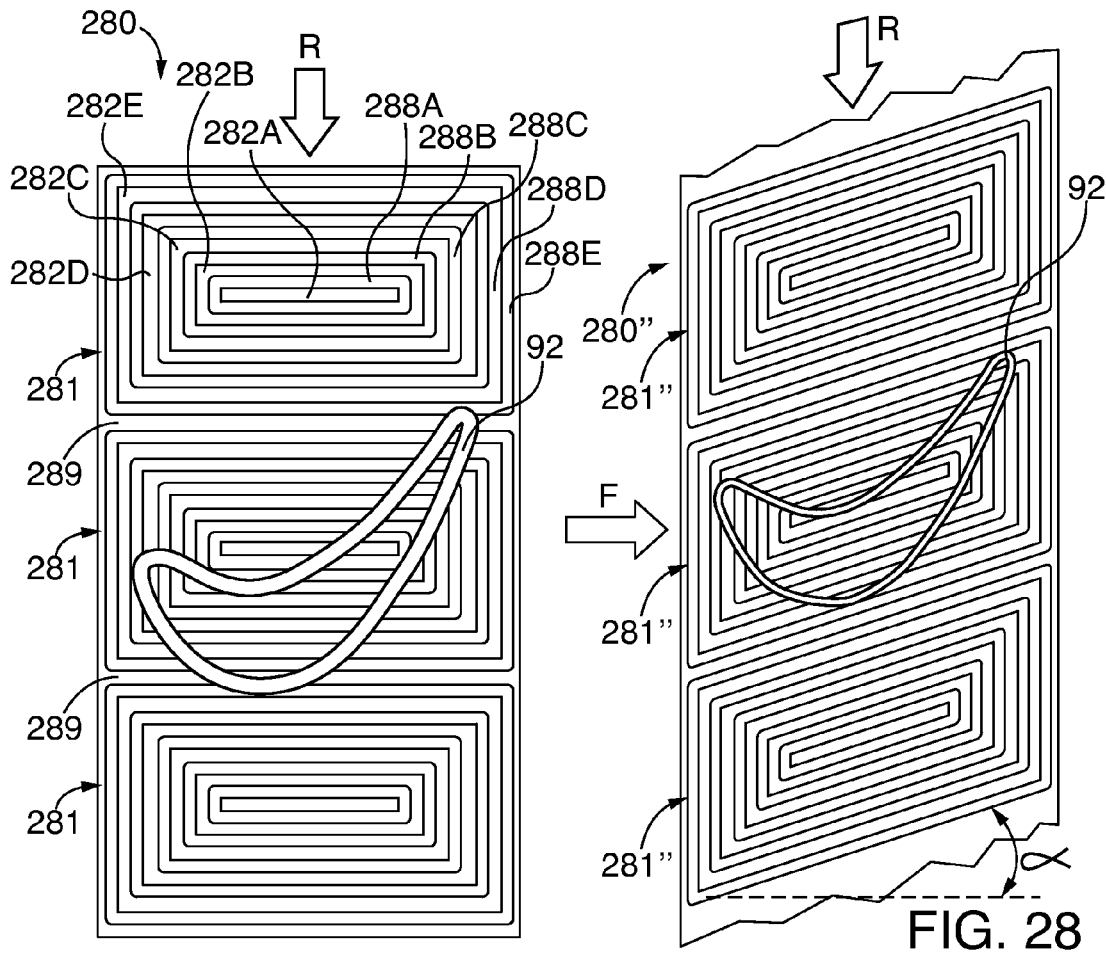
FIG. 26
FIG. 28
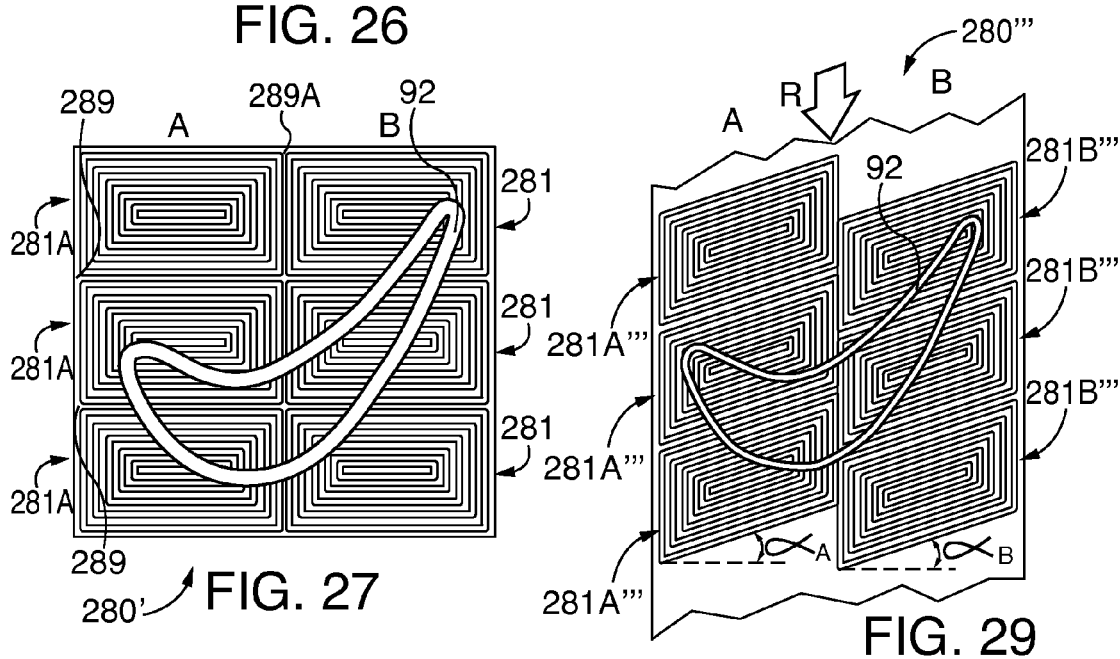
FIG. 27
FIG. 29

PS Tip Rail Leakage Mass Flux

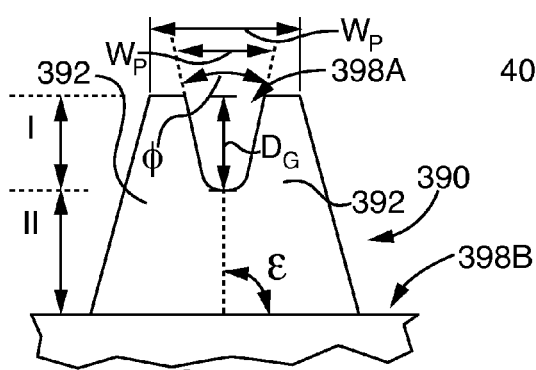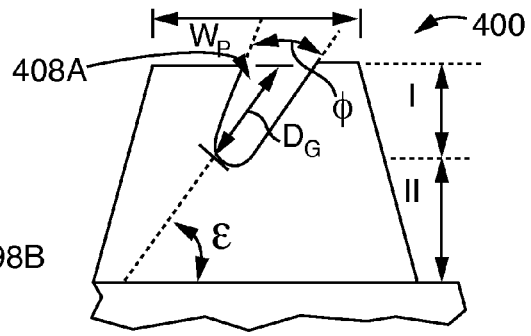
FIG. 50  FIG. 51
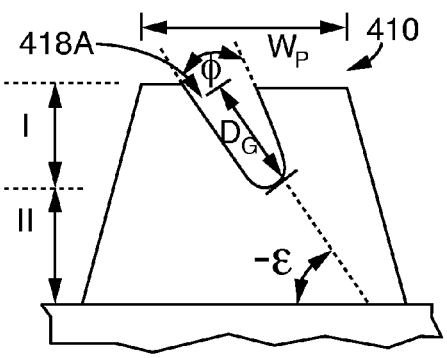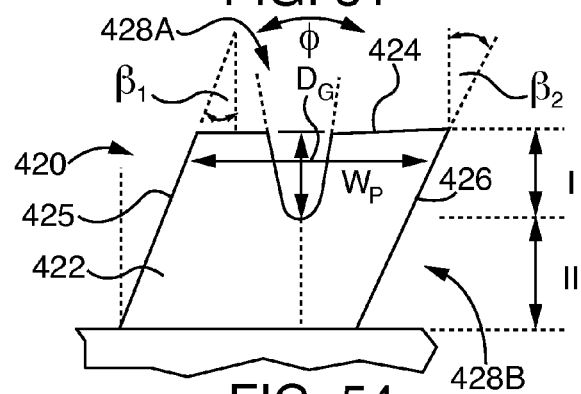
FIG. 52  FIG. 54
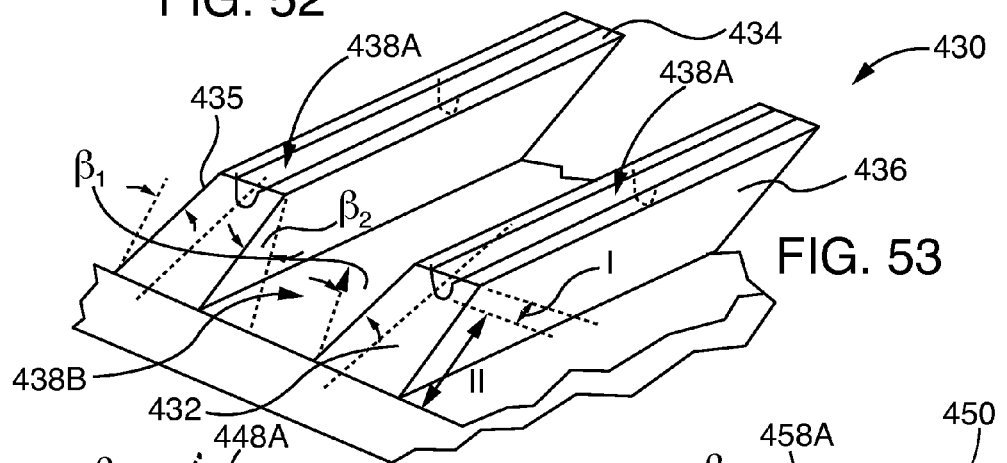
FIG. 53
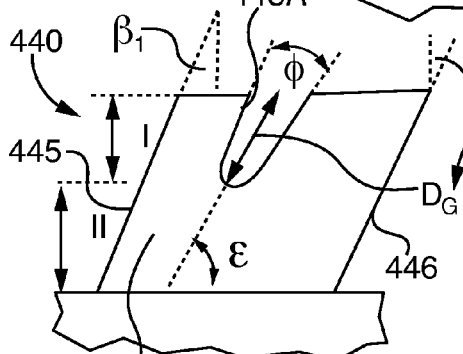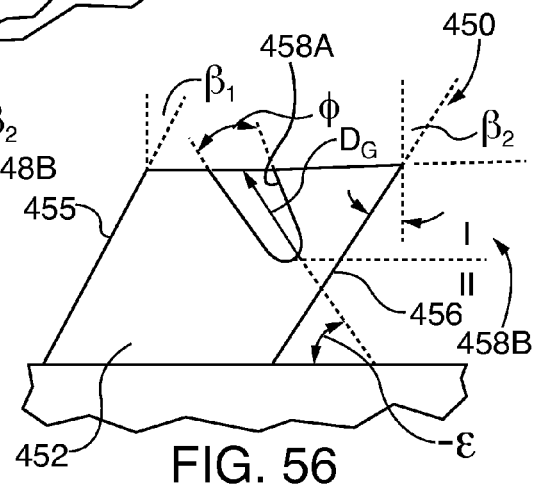
FIG. 55  FIG. 56

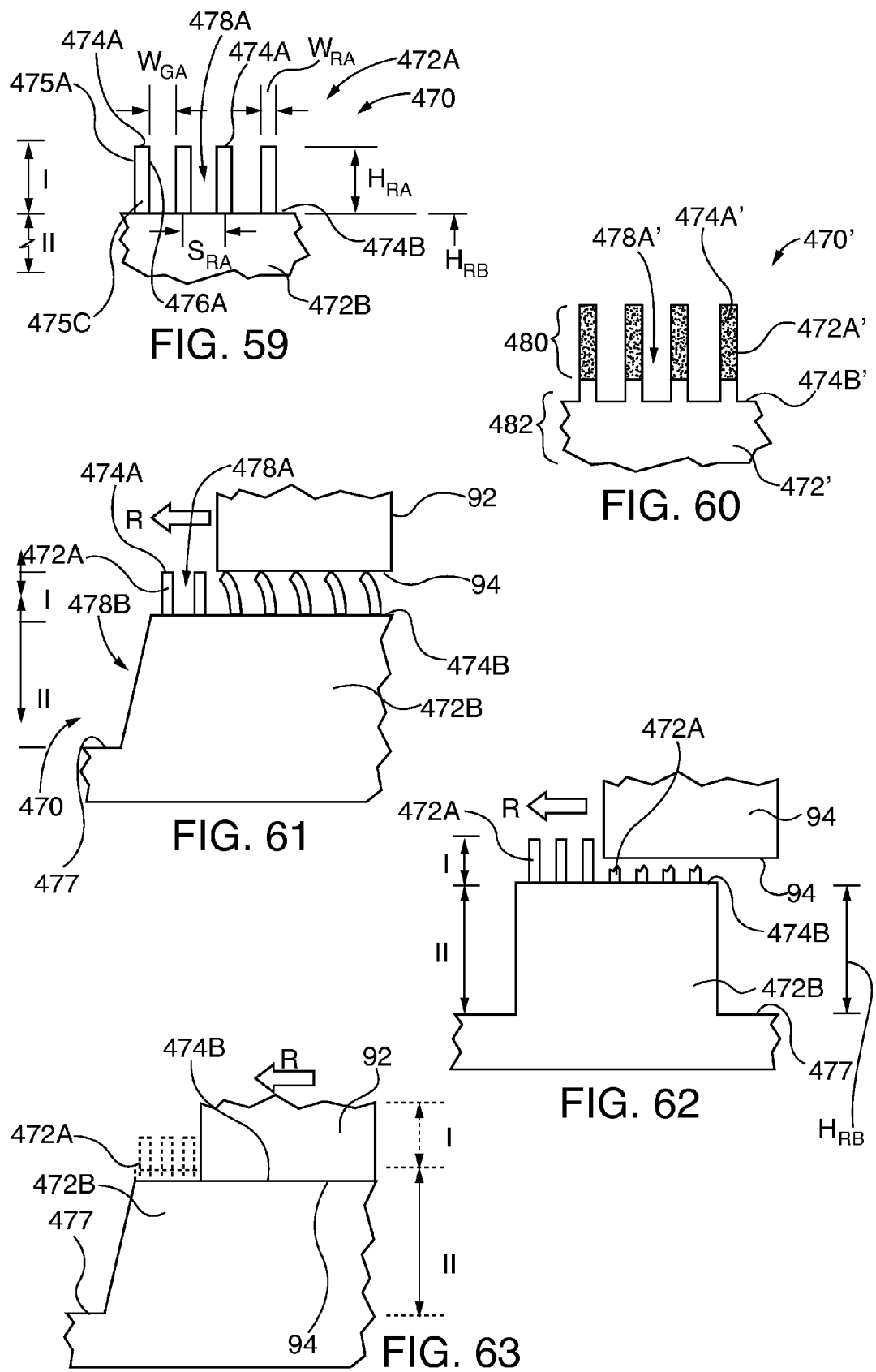

TURBINE ABRADABLE LAYER WITH PROGRESSIVE WEAR ZONE MULTI LEVEL RIDGE ARRAYS

CROSS-REFERENCE TO RELATED APPLICATIONS

The following United States patent applications, including this application were concurrently filed:

"TURBINE ABRADABLE LAYER WITH PROGRESSIVE WEAR ZONE TERRACED RIDGES", filed herewith and assigned Ser. No. 14/188,992;

"TURBINE ABRADABLE LAYER WITH PROGRESSIVE WEAR ZONE MULTI DEPTH GROOVES", filed herewith and assigned Ser. No. 14/188,813;

"TURBINE ABRADABLE LAYER WITH PROGRESSIVE WEAR ZONE HAVING A FRANGIBLE OR PIXELATED NIB SURFACE", filed herewith and assigned Ser. No. 14/188,941;

"TURBINE ABRADABLE LAYER WITH ASYMMETRIC RIDGES OR GROOVES", filed herewith and assigned Ser. No. 14/189,035;

"TURBINE ABRADABLE LAYER WITH ZIG-ZAG GROOVE PATTERN", filed herewith and assigned Ser. No. 14/189,081; and "TURBINE ABRADABLE LAYER WITH NESTED LOOP GROOVE PATTERN", filed herewith and assigned Ser. No. 14/189,011.

This application incorporates by reference all of the other above-cited related applications as if their contents were fully included herein.

BACKGROUND OF THE INVENTION

1. Field of the Invention

The invention relates to abradable surfaces for turbine engines, including gas or steam turbine engines, the engines incorporating such abradable surfaces, and methods for reducing engine blade tip wear and blade tip leakage. More particularly various embodiments of the invention relate to abradable surfaces with different fore and aft ridge and groove planform patterns and/or profiles that incorporate multiple vertical progressive wear zones. The wear zones include a lower layer proximal the abradable surface for structural rigidity, airflow dynamics, thermal and thermal erosion resistance, and abrasion debris transport away from turbine blade tips. The wear zones include an upper layer that preserves desired blade tip gap while reducing blade tip wear. Wear zone ridge/groove planforms and profiles that are constructed in accordance with embodiments of the invention reduce blade tip leakage to improve turbine engine efficiency.

2. Description of the Prior Art

Known turbine engines, including gas turbine engines and steam turbine engines, incorporate shaft-mounted turbine blades circumferentially circumscribed by a turbine casing or housing. Hot gasses flowing past the turbine blades cause blade rotation that converts thermal energy within the hot gasses to mechanical work, which is available for powering rotating machinery, such as an electrical generator. Referring to FIGS. 1-6, known turbine engines, such as the gas turbine engine 80 include a multi stage compressor section 82, a combustor section 84, a multi stage turbine section 86 and an exhaust system 88. Atmospheric pressure intake air is drawn into the compressor section 82 generally in the direction of the flow arrows F along the axial length of the turbine engine 80. The intake air is progressively pressurized in the compressor section 82 by rows rotating compressor blades and directed by mating compressor vanes to the combustor section 84, where it is mixed with fuel and ignited. The ignited fuel/air mixture, now under greater pressure and velocity than the original intake air, is directed to the sequential rows $R_1$, $R_2$, etc., in the turbine section 86. The engine's rotor and shaft 90 has a plurality of rows of airfoil cross sectional shaped turbine blades 92 terminating in distal blade tips 94 in the compressor 82 and turbine 86 sections. For convenience and brevity further discussion of turbine blades and abradable layers in the engine will focus on the turbine section 86 embodiments and applications, though similar constructions are applicable for the compressor section 82. Each blade 92 has a concave profile high pressure side 96 and a convex low pressure side 98. The high velocity and pressure combustion gas, flowing in the combustion flow direction F imparts rotational motion on the blades 92, spinning the rotor. As is well known, some of the mechanical power imparted on the rotor shaft is available for performing useful work. The combustion gasses are constrained radially distal the rotor by turbine casing 100 and proximal the rotor by air seals 102. Referring to the Row 1 section shown in FIG. 2, respective upstream vanes 104 and downstream vanes 106 direct upstream combustion gas generally parallel to the incident angle of the leading edge of turbine blade 92 and redirect downstream combustion gas exiting the trailing edge of the blade.

The turbine engine 80 turbine casing 100 proximal the blade tips 94 is lined with a plurality of sector shaped abradable components 110, each having a support surface 112 retained within and coupled to the casing and an abradable substrate 120 that is in opposed, spaced relationship with the blade tip by a blade tip gap G. The abradable substrate is often constructed of a metallic/ceramic material that has high thermal and thermal erosion resistance and that maintains structural integrity at high combustion temperatures. As the abradable surface 120 metallic ceramic materials is often more abrasive than the turbine blade tip 94 material a blade tip gap G is maintained to avoid contact between the two opposed components that might at best cause premature blade tip wear and in worse case circumstances might cause engine damage. Some known abradable components 110 are constructed with a monolithic metallic/ceramic abradable substrate 120. Other known abradable components 110 are constructed with a composite matrix composite (CMC) structure, comprising a ceramic support surface 112 to which is bonded a friable graded insulation (FGI) ceramic strata of multiple layers of closely-packed hollow ceramic spherical particles, surrounded by smaller particle ceramic filler, as described in U.S. Pat. No. 6,641,907. Spherical particles having different properties are layered in the substrate 120, with generally more easily abradable spheres forming the upper layer to reduce blade tip 94 wear. Another CMC structure is described in U.S. Patent Publication No. 2008/0274336, wherein the surface includes a cut grooved pattern between the hollow ceramic spheres. The grooves are intended to reduce the abradable surface material cross sectional area to reduce potential blade tip 94 wear, if they contact the abradable surface. Other commonly known abradable components 110 are constructed with a metallic base layer support surface 112 to which is applied a thermally sprayed ceramic/metallic layer that forms the abradable substrate layer 120. As will be described in greater detail the thermally sprayed metallic layer may include grooves, depressions or ridges to reduce abradable surface material cross section for potential blade tip 94 wear reduction.

In addition to the desire to prevent blade tip 94 premature wear or contact with the abradable substrate 120, as shown in FIG. 3, for ideal airflow and power efficiency each respective blade tip 94 desirably has a uniform blade tip gap G relative to the abradable component 110 that is as small as possible (ideally zero clearance) to minimize blade tip airflow leakage L between the high pressure blade side 96 and the low pressure blade side 98 as well as axially in the combustion flow direction F. However, manufacturing and operational tradeoffs require blade tip gaps G greater than zero. Such tradeoffs include tolerance stacking of interacting components, so that a blade constructed on the higher end of acceptable radial length tolerance and an abradable component abradable substrate 120 constructed on the lower end of acceptable radial tolerance do not impact each other excessively during operation. Similarly, small mechanical alignment variances during engine assembly can cause local variations in the blade tip gap. For example in a turbine engine of many meters axial length, having a turbine casing abradable substrate 120 inner diameter of multiple meters, very small mechanical alignment variances can impart local blade tip gap G variances of a few millimeters.

During turbine engine 80 operation the turbine engine casing 100 may experience out of round (e.g., egg shaped) thermal distortion as shown in FIGS. 4 and 6. Casing 100 thermal distortion potential increases between operational cycles of the turbine engine 80 as the engine is fired up to generate power and subsequently cooled for servicing after thousands of hours of power generation. Commonly, as shown in FIG. 6, greater casing 100 and abradable component 110 distortion tends to occur at the uppermost 122 and lowermost 126 casing circumferential positions (i.e., 6:00 and 12:00 positions) compared to the lateral right 124 and left 128 circumferential positions (i.e., 3:00 and 9:00). If, for example as shown in FIG. 4 casing distortion at the 6:00 position causes blade tip contact with the abradable substrate 120 one or more of the blade tips may be worn during operation, increasing the blade tip gap locally in various other less deformed circumferential portions of the turbine casing 100 from the ideal gap G to a larger gap $G_W$ as shown in FIG. 5. The excessive blade gap $G_W$ distortion increases blade tip leakage L, diverting hot combustion gas away from the turbine blade 92 airfoil, reducing the turbine engine's efficiency.

In the past flat abradable surface substrates 120 were utilized and the blade tip gap G specification conservatively chosen to provide at least a minimal overall clearance to prevent blade tip 94 and abradable surface substrate contact within a wide range of turbine component manufacturing tolerance stacking, assembly alignment variances, and thermal distortion. Thus, a relatively wide conservative gap G specification chosen to avoid tip/substrate contact sacrificed engine efficiency. Commercial desire to enhance engine efficiency for fuel conservation has driven smaller blade tip gap G specifications: preferably no more than 2 millimeters and desirably approaching 1 millimeter.

In order to reduce likelihood of blade tip/substrate contact, abradable components comprising metallic base layer supports with thermally sprayed metallic/ceramic abradable surfaces have been constructed with three dimensional planform profiles, such as shown in FIGS. 7 11. The exemplary known abradable surface component 130 of FIGS. 7 and 10 has a metallic base layer support 131 for coupling to a turbine casing 100, upon which a thermally sprayed metallic/ceramic layer has been deposited and formed into three-dimensional ridge and groove profiles by known deposition or ablative material working methods. Specifically in these cited figures a plurality of ridges 132 respectively have a common height $H_R$ distal ridge tip surface 134 that defines the blade tip gap G between the blade tip 94 and it. Each ridge also has side walls 135 and 136 that extend from the substrate surface 137 and define grooves 138 between successive ridge opposed side walls. The ridges 132 are arrayed with parallel spacing $S_R$ between successive ridge center lines and define groove widths $W_G$. Due to the abradable component surface symmetry, groove depths $D_G$ correspond to the ridge heights $H_R$. Compared to a solid smooth surface abradable, the ridges 132 have smaller cross section and more limited abrasion contact in the event that the blade tip gap G becomes so small as to allow blade tip 94 to contact one or more tips 134. However the relatively tall and widely spaced ridges 132 allow blade leakage L into the grooves 138 between ridges, as compared to the prior continuous flat abradable surfaces. In an effort to reduce blade tip leakage L, the ridges 132 and grooves 138 were oriented horizontally in the direction of combustion flow F (not shown) or diagonally across the width of the abradable surface 137, as shown in FIG. 7, so that they would tend to inhibit the leakage. Other known abradable components 140, shown in FIG. 8, have arrayed grooves 148 in crisscross patterns, forming diamond shaped ridge planforms 142 with flat, equal height ridge tips 144. Additional known abradable components have employed triangular rounded or flat tipped triangular ridges 152 shown in FIGS. 9 and 11. In the abradable component 150 of FIGS. 9 and 11, each ridge 152 has symmetrical side walls 155, 156 that terminate in a flat ridge tip 154. All ridge tips 154 have a common height $H_R$ and project from the substrate surface 157. Grooves 158 are curved and have a similar planform profile as the blade tip 94 camber line. Curved grooves 158 generally are more difficult to form than linear grooves 138 or 148 of the abradable components shown in FIGS. 7 and 8.

Past abradable component designs have required stark compromises between blade tips wear resulting from contact between the blade tip and the abradable surface and blade tip leakage that reduces turbine engine operational efficiency. Optimizing engine operational efficiency required reduced blade tip gaps and smooth, consistently flat abradable surface topology to hinder air leakage through the blade tip gap, improving initial engine performance and energy conservation. In another drive for increased gas turbine operational efficiency and flexibility so-called "fast start" mode engines were being constructed that required faster full power ramp up (order of 40-50 Mw/minute). Aggressive ramp-up rates exacerbated potential higher incursion of blade tips into ring segment abradable coating, resulting from quicker thermal and mechanical growth and higher distortion and greater mismatch in growth rates between rotating and stationary components. This in turn required greater turbine tip clearance in the "fast start" mode engines, to avoid premature blade tip wear, than the blade tip clearance required for engines that are configured only for "standard" starting cycles. Thus as a design choice one needed to balance the benefits of quicker startup/lower operational efficiency larger blade tip gaps or standard startup/higher operational efficiency smaller blade tip gaps. Traditionally standard or fast start engines required different construction to accommodate the different needed blade tip gap parameters of both designs. Whether in standard or fast start configuration, decreasing blade tip gap for engine efficiency optimization ultimately risked premature blade tip wear, opening the blade tip gap and ultimately decreasing longer term engine performance efficiency during the engine operational cycle. The aforementioned ceramic matrix composite (CMC) abradable component designs sought to maintain airflow control benefits and small blade tip gaps of flat surface profile abradable surfaces by using a softer top abradable layer to mitigate blade tip wear. The abradable components of the U.S. Patent Publication No. 2008/0274336 also sought to reduce blade tip wear by incorporating grooves between the upper layer hollow ceramic spheres. However groove dimensions were inherently limited by the packing spacing and diameter of the spheres in order to prevent sphere breakage. Adding uniform height abradable surface ridges to thermally sprayed substrate profiles as a compromise solution to reduce blade tip gap while reducing potential rubbing contact surface area between the ridge tips and blade tips reduced likelihood of premature blade tip wear/increasing blade tip gap but at the cost of increased blade tip leakage into grooves between ridges. As noted above, attempts have been made to reduce blade tip leakage flow by changing planform orientation of the ridge arrays to attempt to block or otherwise control leakage airflow into the grooves.

SUMMARY OF THE INVENTION

Objects of various embodiments of the invention are to enhance engine efficiency performance by reducing and controlling blade tip gap despite localized variations caused by such factors as component tolerance stacking, assembly alignment variations, blade/casing deformities evolving during one or more engine operational cycles in ways that do not unduly cause premature blade tip wear.

In localized wear zones where the abradable surface and blade tip have contacted each other objects of various embodiments of the invention are to minimize blade tip wear while maintaining minimized blade tip leakage in those zones and maintaining relatively narrow blade tip gaps outside those localized wear zones.

Objects of other embodiments of the invention are to reduce blade tip gap compared to known abradable component abradable surfaces to increase turbine operational efficiency without unduly risking premature blade tip wear that might arise from a potentially increased number of localized blade tip/abradable surface contact zones.

Objects of yet other embodiments of the invention are to reduce blade tip leakage by utilizing abradable surface ridge and groove composite distinct forward and aft profiles and planform arrays that inhibit and/or redirect blade tip leakage.

Objects of additional embodiments of the invention are to provide groove channels for transporting abraded materials and other particulate matter axially through the turbine along the abradable surface so that they do not impact or otherwise abrade the rotating turbine blades.

In various embodiments of the invention, turbine casing abradable components have distinct forward upstream and aft downstream composite multi orientation groove and vertically projecting ridges planform patterns, to reduce, redirect and/or block blade tip airflow leakage downstream into the grooves rather than from turbine blade airfoil high to low pressure sides. Planform pattern embodiments are composite multi groove/ridge patterns that have distinct forward upstream (zone A) and aft downstream patterns (zone B). Those combined zone A and zone B ridge/groove array planforms direct gas flow trapped inside the grooves toward the downstream combustion flow F direction to discourage gas flow leakage directly from the pressure side of the turbine blade airfoil toward the suction side of the airfoil in the localized blade leakage direction L. The forward zone is generally defined between the leading edge and the midchord of the blade airfoil at a cutoff point where a line parallel to the turbine 80 axis is roughly in tangent to the pressure side surface of the airfoil: roughly one-third to one-half of the total axial length of the airfoil. The remainder of the array pattern comprises the aft zone B. The aft downstream zone B grooves and ridges are angularly oriented opposite the blade rotational direction R. The range of angles is approximately 30% to 120% of the associated turbine blade 92 camber or trailing edge angle.

In other various embodiments of the invention the abradable components are constructed with vertically projecting ridges or ribs having first lower and second upper wear zones. The ridge first lower zone, proximal the abradable surface, is constructed to optimize engine airflow characteristics with planform arrays and projections tailored to reduce, redirect and/or block blade tip airflow leakage into grooves between ridges. The lower zone of the ridges are also optimized to enhance the abradable component and surface mechanical and thermal structural integrity, thermal resistance, thermal erosion resistance and wear longevity, The ridge upper zone is formed above the lower zone and is optimized to minimize blade tip gap and wear by being more easily abradable than the lower zone. Various embodiments of the abradable component afford easier abradability of the upper zone with upper sub ridges or nibs having smaller cross sectional area than the lower zone rib structure. In some embodiments the upper sub ridges or nibs are formed to bend or otherwise flex in the event of minor blade tip contact and wear down and/or shear off in the event of greater blade tip contact. In other embodiments the upper zone sub ridges or nibs are pixelated into arrays of upper wear zones so that only those nibs in localized contact with one or more blade tips are worn while others outside the localized wear zone remain intact. While upper zone portions of the ridges are worn away they cause less blade tip wear than prior known monolithic ridges. In embodiments of the invention as the upper zone ridge portions are worn away the remaining lower ridge portion preserves engine efficiency by controlling blade tip leakage. In the event that the localized blade tip gap is further reduced the blade tips wear away the lower ridge portion at that location. However the relatively higher ridges outside that lower ridge portion localized wear area maintain smaller blade tip gaps to preserve engine performance efficiency. Additionally the multi-level wear zone profiles allow a single turbine engine design to be operated in standard or "fast start" modes. When operated in fast start mode the engine will have a propensity to wear the upper wear zone layer with less likelihood of excessive blade tip wear, while preserving the lower wear zone aerodynamic functionality. When the same engine is operated in standard start mode there is more likelihood that both abradable upper and lower wear zones will be preserved for efficient engine operation. More than two layered wear zones (e.g., upper, middle and lower wear zones) can be employed in an abradable component constructed in accordance with embodiments of the invention.

In some invention embodiments ridge and groove profiles and planform arrays are tailored locally or universally throughout the abradable component by forming multi-layer grooves with selected orientation angles and/or cross sectional profiles chosen to reduce blade tip leakage. In some embodiments the abradable component surface planform arrays and profiles of ridges and grooves provide enhanced blade tip leakage airflow control yet also facilitate simpler manufacturing techniques than known abradable components.

Some of these and other suggested objects are achieved in one or more embodiments of the invention by turbine abradable components, featuring a support surface for coupling to a turbine casing and an abradable substrate coupled to the support surface, having a substrate surface adapted for opposed, spaced orientation proximal a rotating turbine blade tip circumferential swept path. The substrate surface features alternating rows of opposed, continuous elongated first and second ridges spanning at least sixty percent of and projecting from the substrate surface. The first ridges have a first ridge height greater than the second ridges second ridge height.

Other embodiments of the invention are directed to methods for reducing turbine engine blade tip wear by providing a turbine having a turbine housing and a rotor having blades rotatively mounted in the turbine housing, distal tips of which forming a blade tip circumferential swept path in the blade rotation direction and axially with respect to the turbine housing. A generally arcuate shaped abradable component is inserted in the housing in opposed, spaced relationship with the blade tips, defining a blade gap there between. The inserted abradable component features a support surface for coupling to the turbine casing and an abradable substrate coupled to the support surface, having a substrate surface adapted for orientation proximal a rotating turbine blade tip circumferential swept path. The abradable component substrate surface features alternating rows of opposed, continuous elongated first and second ridges spanning at least sixty percent of and projecting from the substrate surface. The first ridges have a first ridge height greater than the second ridges second ridge height. The turbine engine is operated so that any contact between the blade tips and the abradable surface initially abrades higher first ridges tips. The remaining non-abraded first ridges and the second ridges inhibit blade tip gas flow between the blade tips and substrate surface.

Additional embodiments of the invention are directed to turbine engines featuring a turbine housing; a rotor having blades rotatively mounted in the turbine housing, distal tips of which forming a blade tip circumferential swept path in the blade rotation direction and axially with respect to the turbine housing; and an abradable component. The abradable component features a support surface for coupling to a turbine casing and an abradable substrate coupled to the support surface, having a substrate surface adapted for opposed, spaced orientation proximal a rotating turbine blade tip circumferential swept path. The substrate surface features alternating rows of opposed, continuous elongated first and second ridges spanning at least sixty percent of and projecting from the substrate surface. The first ridges have a first ridge height greater than the second ridges second ridge height.

The respective objects and features of the invention may be applied jointly or severally in any combination or sub-combination by those skilled in the art.

BRIEF DESCRIPTION OF THE DRAWINGS

The teachings of the invention can be readily understood by considering the following detailed description in conjunction with the accompanying drawings, in which:

FIGS. 7-9 are plan or plan form views of known ridge and groove patterns for turbine engine abradable surfaces;

FIGS. 10 and 11 are cross sectional elevational views of known ridge and groove patterns for turbine engine abradable surfaces taken along sections C-C of FIGS. 7 and 9, respectively;

FIGS. 12-17 are plan or plan form views of "hockey stick" configuration ridge and groove patterns of turbine engine abradable surfaces, in accordance with exemplary embodiments of the invention, with schematic overlays of turbine blades;

FIGS. 18 and 19 are plan or plan form views of another "hockey stick" configuration ridge and groove pattern for a turbine engine abradable surface that includes vertically oriented ridge or rib arrays aligned with a turbine blade rotational direction, in accordance with another exemplary embodiment of the invention, and a schematic overlay of a turbine blade;

FIG. 20 is a comparison graph of simulated blade tip leakage mass flux from leading to trailing edge for a respective exemplary continuous groove hockey stick abradable surface profile of the type shown in FIGS. 12-17 and a split groove with interrupting vertical ridges hockey stick abradable surface profile of the type shown in FIGS. 18 and 19;

FIG. 21 is a plan or plan form view of another "hockey stick" configuration ridge and groove pattern for an abradable surface, having intersecting ridges and grooves, in accordance with another exemplary embodiment of the invention, and a schematic overlay of a turbine blade;

FIG. 24 is a plan or plan form view of a "zig-zag" configuration ridge and groove pattern for an abradable surface, which includes diagonally oriented ridge and groove arrays across the abradable surface, in accordance with another exemplary embodiment of the invention;

FIG. 25 is a plan or plan form view of a "zig-zag" configuration ridge and groove pattern for an abradable surface, which includes Vee shaped ridge and groove arrays across the abradable surface, in accordance with another exemplary embodiment of the invention;

FIGS. 26-29 are plan or plan form views of nested loop configuration ridge and groove patterns of turbine engine abradable surfaces, in accordance with exemplary embodiments of the invention, with schematic overlays of turbine blades;

FIG. 50 is an elevational cross sectional view of cross sectional view of a multi depth, parallel groove profile configuration in a symmetric profile ridge for an abradable surface, in accordance with another embodiment of the invention;

FIGS. 51 and 52 are respective elevational cross sectional views of multi depth, parallel groove profile configurations in a symmetric profile ridge for an abradable surface, wherein an upper groove is tilted laterally relative to the ridge tip, in accordance with an embodiment of the invention;

FIG. 53 is a perspective view of an abradable surface, in accordance with embodiment of the invention, having asymmetric, non-parallel wall ridges and multi depth grooves;

FIGS. 54-56 are respective elevational cross sectional views of multi depth, parallel groove profile configurations in a trapezoidal profile ridge for an abradable surface, wherein an upper groove is normal to or tilted laterally relative to the ridge tip, in accordance with alternative embodiments of the invention;

FIG. 59 is an elevational view of a row of pixelated upstanding nibs projecting from the lower ridge plateau, taken along C-C of FIG. 58;

FIG. 60 is an alternate embodiment of the upstanding nibs of FIG. 59, wherein the nib portion proximal the nib tips are constructed of a layer of material having different physical properties than the material below the layer, in accordance with an embodiment of the invention;

FIG. 61 is a schematic elevational view of the pixelated upper nib embodiment of FIG. 58, wherein the turbine blade tip deflects the nibs during blade rotation;

FIG. 62 is a schematic elevational view of the pixelated upper nib embodiment of FIG. 58, wherein the turbine blade tip shears off all or a part of upstanding nibs during blade rotation, leaving the lower ridge and its plateau intact and spaced radially from the blade tip by a blade tip gap; and FIG. 63 is a schematic elevational view of the pixelated upper nib embodiment of FIG. 58, wherein the turbine blade tip has sheared off all of the upstanding nibs during blade rotation and is abrading the plateau surface of the lower ridge portion.

Figure 1:
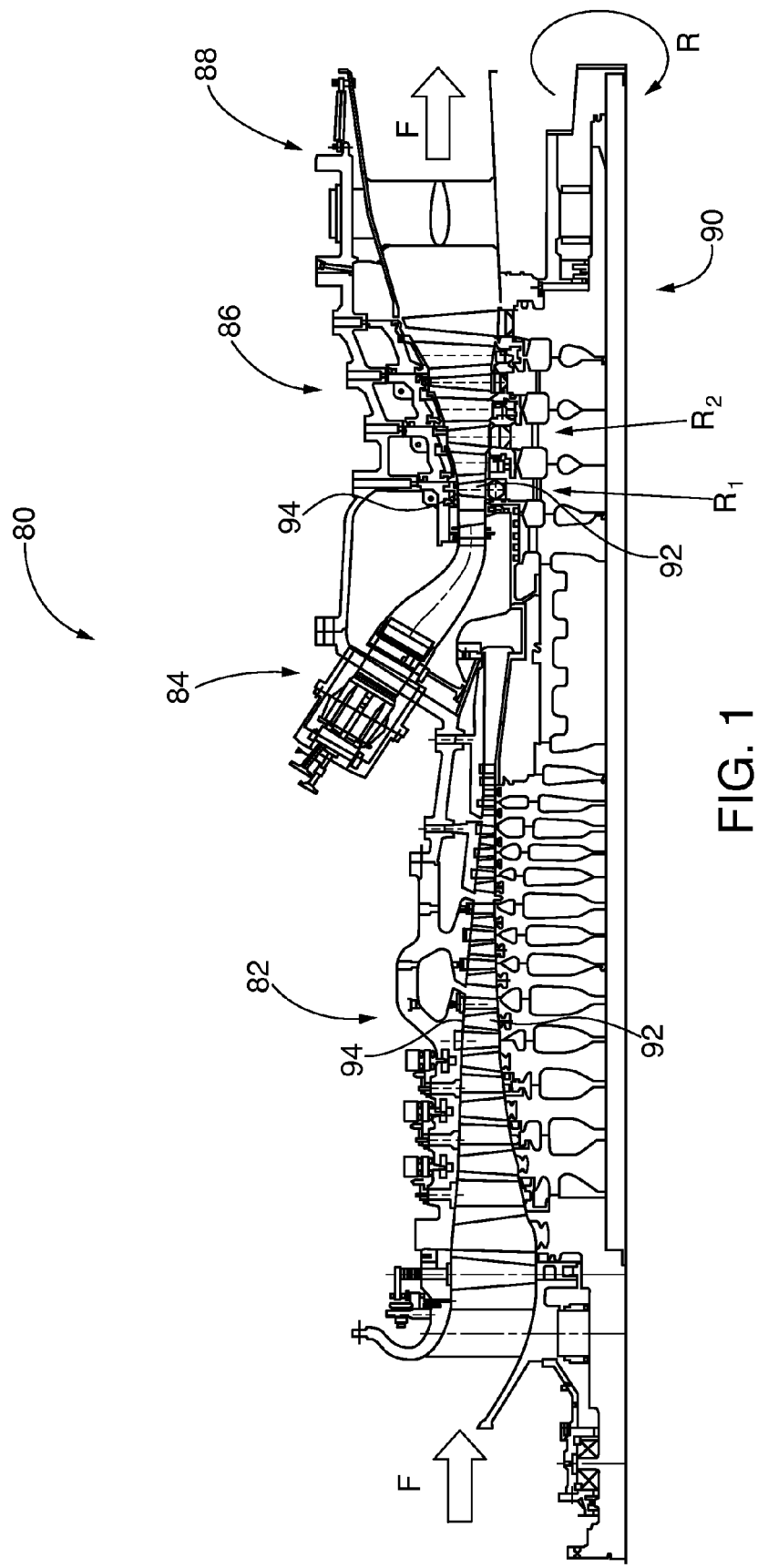
FIG. 1 is a partial axial cross sectional view of an exemplary known gas turbine engine.
Figure 2:
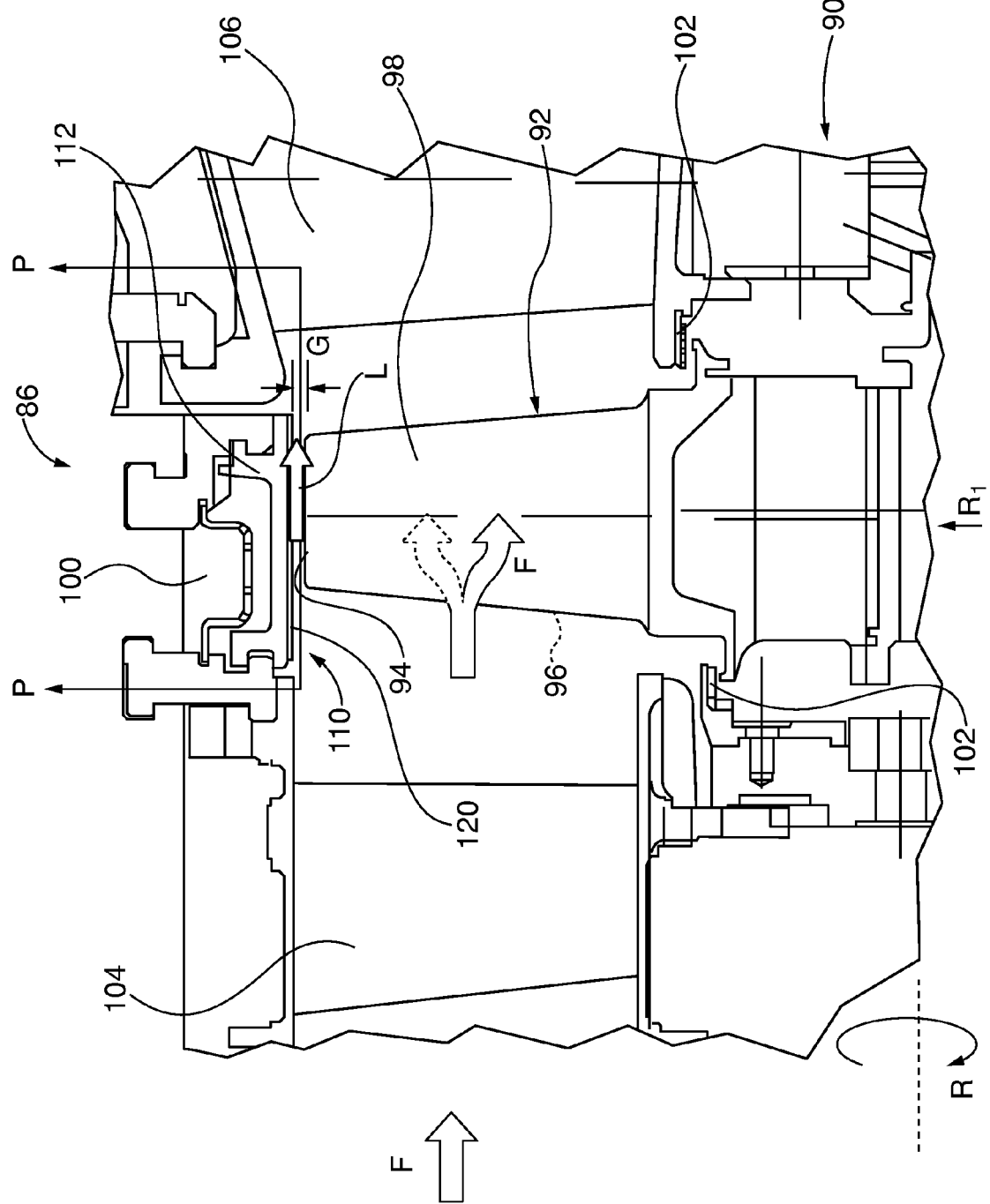
FIG. 2 is a detailed cross sectional elevational view of Row 1 turbine blade and vanes showing blade tip gap G between a blade tip and abradable component of the turbine engine of FIG. 1.
Figure 3:
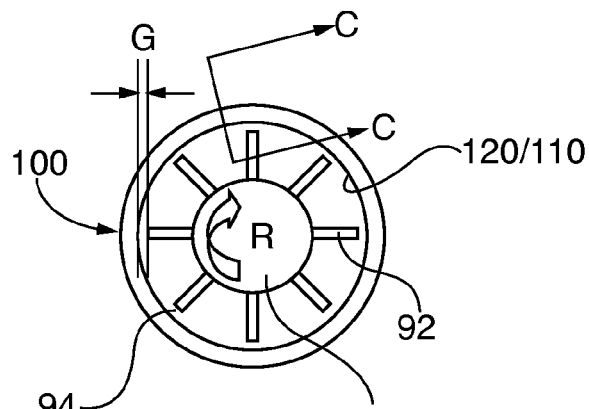
FIG. 3 is a radial cross sectional schematic view of a known turbine engine, with ideal uniform blade tip gap G between all blades and all circumferential orientations about the engine abradable surface.
Figure 4:
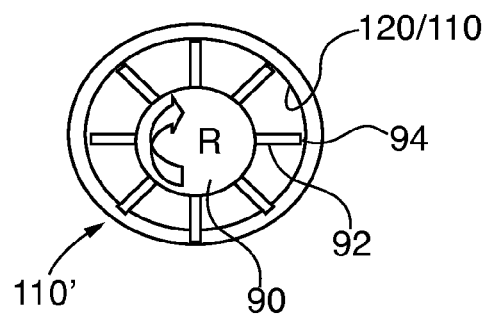
FIG. 4 is a radial cross sectional schematic view of an out of round known turbine engine showing blade tip and abradable surface contact at the 12:00 uppermost and 6:00 lowermost circumferential positions.
Figure 5:
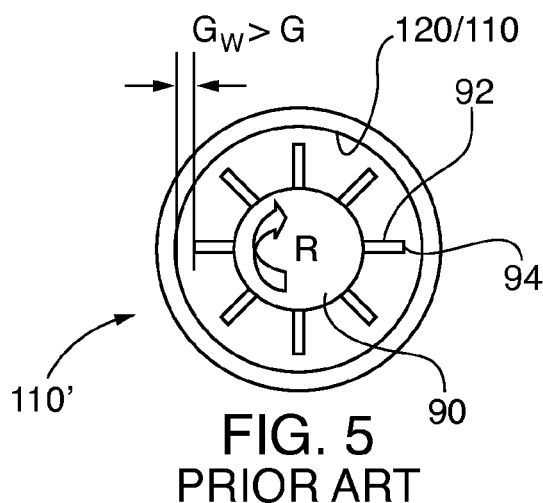
FIG. 5 is a radial cross sectional schematic view of a known turbine engine that has been in operational service with an excessive blade tip gap $G_W$ that is greater than the original design specification blade tip gap G.

To facilitate understanding, identical reference numerals have been used, where possible, to designate identical elements that are common to the figures. The figures are not drawn to scale. The following common designators for dimensions, cross sections, fluid flow, turbine blade rotation, axial or radial orientation and fluid pressure have been utilized throughout the various invention embodiments described herein: A forward or upstream zone of an abradable surface;

B aft or downstream zone of an abradable surface;
C-C abradable cross section;
$D_G$ abradable groove depth;
F flow direction through turbine engine;
G turbine blade tip to abradable surface gap;
$G_W$ worn turbine blade tip to abradable surface gap;
$H_R$ abradable ridge height;
L turbine blade tip leakage;
P abradable surface plan view or planform;
$P_P$ turbine blade higher pressure side;
$P_S$ turbine blade lower pressure or suction side;
R turbine blade rotational direction;
$R_1$ Row 1 of the turbine engine turbine section;

$R_2$ Row 2 of the turbine engine turbine section;
$S_R$ abradable ridge centerline spacing;
$W_G$ abradable groove width;
$W_R$ abradable ridge width;
α abradable groove planform angle relative to the turbine engine axial dimension;
β abradable ridge sidewall angle relative to vertical or normal the abradable surface;
γ abradable groove fore-aft tilt angle relative to abradable ridge height;
Δ abradable groove skew angle relative to abradable ridge longitudinal axis;
ε abradable upper groove tilt angle relative to abradable surface and/or ridge surface; and
Φ abradable groove arcuate angle.

DETAILED DESCRIPTION

Embodiments of invention described herein can be readily utilized in abradable components for turbine engines, including gas turbine engines. In various embodiments, turbine casing abradable components have distinct forward upstream and aft downstream composite multi orientation groove and vertically projecting ridges planform patterns, to reduce, redirect and/or block blade tip airflow leakage downstream into the grooves rather than from turbine blade airfoil high to low pressure sides. Planform pattern embodiments are composite multi groove/ridge patterns that have distinct forward upstream (zone A) and aft downstream patterns (zone B). Those combined zone A and zone B ridge/groove array planforms direct gas flow trapped inside the grooves toward the downstream combustion flow F direction to discourage gas flow leakage directly from the pressure side of the turbine airfoil toward the suction side of the airfoil in the localized blade leakage direction L. The forward zone is generally defined between the leading edge and the mid-chord of the blade airfoil at a cutoff point where a line parallel to the turbine axis is roughly in tangent to the pressure side surface of the airfoil: roughly one-third to one-half of the total axial length of the airfoil. The remainder of the array pattern comprises the aft zone B. The aft downstream zone B grooves and ridges are angularly oriented opposite the blade rotational direction R. The range of angles is approximately 30% to 120% of the associated turbine blade 92 camber or trailing edge angle.

In various embodiments of the invention, the thermally sprayed ceramic/metallic abradable layers of abradable components are constructed with vertically projecting ridges or ribs having first lower and second upper wear zones. The ridge first lower zone, proximal the thermally sprayed abradable surface, is constructed to optimize engine airflow characteristics with planform arrays and projections tailored to reduce, redirect and/or block blade tip airflow leakage into grooves between ridges. In some embodiments the upper wear zone of the thermally sprayed abradable layer is approximately ⅓-⅔ of the lower wear zone height or the total ridge height. Ridges and grooves are constructed in the thermally sprayed abradable layer with varied symmetrical and asymmetrical cross sectional profiles and planform arrays to redirect blade tip leakage flow and/or for ease of manufacture. In some embodiments the groove widths are approximately ⅓-⅔ of the ridge width or of the lower ridge width (if there are multi width stacked ridges). In various embodiments the lower zones of the ridges are also optimized to enhance the abradable component and surface mechanical and thermal structural integrity, thermal resistance, thermal erosion resistance and wear longevity. The ridge upper zone is formed above the lower zone and is optimized to minimize blade tip gap and wear by being more easily abradable than the lower zone. Various embodiments of the thermally sprayed abradable layer abradable component afford easier abradability of the upper zone with upper sub ridges or nibs having smaller cross sectional area than the lower zone rib structure. In some embodiments the upper sub ridges or nibs are formed to bend or otherwise flex in the event of minor blade tip contact and wear down and/or shear off in the event of greater blade tip contact. In other embodiments the upper zone sub ridges or nibs are pixelated into arrays of upper wear zones so that only those nibs in localized contact with one or more blade tips are worn while others outside the localized wear zone remain intact. While upper zone portions of the ridges are worn away they cause less blade tip wear than prior known monolithic ridges. In embodiments of the invention as the upper zone ridge portion is worn away the remaining lower ridge portion preserves engine efficiency by controlling blade tip leakage. In the event that the localized blade tip gap is further reduced the blade tips wear away the lower ridge portion at that location. However the relatively higher ridges outside that lower ridge portion localized wear area maintain smaller blade tip gaps to preserve engine performance efficiency. More than two layered wear zones (e.g., upper, middle and lower wear zones) can be employed in an abradable component constructed in accordance with embodiments of the invention.

In some invention embodiments the ridge and groove profiles and planform arrays in the thermally sprayed abradable layer are tailored locally or universally throughout the abradable component by forming multi-layer grooves with selected orientation angles and/or cross sectional profiles chosen to reduce blade tip leakage and vary ridge cross section. In some embodiments the abradable component surface planform arrays and profiles of ridges and grooves provide enhanced blade tip leakage airflow control yet also facilitate simpler manufacturing techniques than known abradable components.

In some embodiments the abradable components and their abradable surfaces are constructed of multi-layer thermally sprayed ceramic material of known composition and in known layer patterns/dimensions on a metal support layer. In embodiments the ridges are constructed on abradable surfaces by known additive processes that thermally spray (without or through a mask), layer print or otherwise apply ceramic or metallic/ceramic material to a metal substrate (with or without underlying additional support structure). Grooves are defined in the voids between adjoining added ridge structures. In other embodiments grooves are constructed by abrading or otherwise removing material from the thermally sprayed substrate using known processes (e.g., machining, grinding, water jet or laser cutting or combinations of any of them), with the groove walls defining separating ridges. Combinations of added ridges and/or removed material grooves may be employed in embodiments described herein. The abradable component is constructed with a known support structure adapted for coupling to a turbine engine casing and known abradable surface material compositions, such as a bond coating base, thermal coating and one or more layers of heat/thermal resistant top coating. For example the upper wear zone can be constructed from a thermally sprayed abradable material having different composition and physical properties than another thermally sprayed layer immediately below it or other sequential layers.

Various thermally sprayed, metallic support layer abradable component ridge and groove profiles and arrays of grooves and ridges described herein can be combined to satisfy performance requirements of different turbine applications, even though not every possible combination of embodiments and features of the invention is specifically described in detail herein.

Abradable Surface Planforms

Exemplary invention embodiment abradable surface ridge and groove planform patterns are shown in FIGS. 12-37 and 57. Unlike known abradable planform patterns that are uniform across an entire abradable surface, many of the present invention planform pattern embodiments are composite multi groove/ridge patterns that have distinct forward upstream (zone A) and aft downstream patterns (zone B). Those combined zone A and zone B ridge/groove array planforms direct gas flow trapped inside the grooves toward the downstream combustion flow F direction to discourage gas flow leakage directly from the pressure side of the turbine airfoil toward the suction side of the airfoil in the localized blade leakage direction L. The forward zone is generally defined between the leading edge and the mid-chord of the blade 92 airfoil at a cutoff point where a line parallel to the turbine 80 axis is roughly in tangent to the pressure side surface of the airfoil. From a more gross summary perspective, the axial length of the forward zone A can also be defined generally as roughly one-third to one-half of the total axial length of the airfoil. The remainder of the array pattern comprises the aft zone B. More than two axially oriented planform arrays can be constructed in accordance with embodiments of the invention. For example forward, middle and aft ridge/groove array planforms can be constructed on the abradable component surface.

The embodiments shown in FIGS. 12-19, 21, 22, 34-35, 37 and 57 have hockey stick-like planform patterns. The forward upstream zone A grooves and ridges are aligned generally parallel (+/−10%) to the combustion gas axial flow direction F within the turbine 80 (see FIG. 1). The aft downstream zone B grooves and ridges are angularly oriented opposite the blade rotational direction R. The range of angles is approximately 30% to 120% of the associated turbine blade 92 camber or trailing edge angle. For design convenience the downstream angle selection can be selected to match any of the turbine blade high or low pressure averaged (linear average line) side wall surface or camber angle (see, e.g., angle $\alpha_{B2}$ of FIG. 14 on the high pressure side, commencing at the zone B starting surface and ending at the blade trailing edge), the trailing edge angle (see, e.g., angle $\alpha_{B1}$ of FIG. 15); the angle matching connection between the leading and trailing edges (see, e.g., angle $\alpha_{B1}$ of FIG. 14); or any angle between such blade geometry established angles, such as $\alpha_{B3}$. Hockey stick-like ridge and groove array planform patterns are as relatively easy to form on an abradable surface as purely horizontal or diagonal know planform array patterns, but in fluid flow simulations the hockey stick-like patterns have less blade tip leakage than either of those known unidirectional planform patterns. The hockey stick-like patterns are formed by known cutting/abrading or additive layer building methods that have been previously used to form known abradable component ridge and groove patterns.

In FIG. 12, the abradable component 160 has forward ridges/ridge tips 162A/164A and grooves 168A that are oriented at angle $\alpha_A$ within +/−10 degrees relative to the axial turbine axial flow direction F. The aft ridges/ridge tips 162B/164B and grooves 168B are oriented at an angle $\alpha_B$ that is approximately the turbine blade 92 trailing edge angle. As shown schematically in FIG. 12, the forward ridges 162A block the forward zone A blade leakage direction and the rear ridges 162B block the aft zone B blade leakage L. Horizontal spacer ridges 169 are periodically oriented axially across the entire blade 92 footprint and about the circumference of the abradable component surface 167, in order to block and disrupt blade tip leakage L, but unlike known design flat, continuous surface abradable surfaces reduce potential surface area that may cause blade tip contact and wear.

The abradable component 170 embodiment of FIG. 13 is similar to that of FIG. 12, with the forward portion ridges 172A/174A and grooves 178A oriented generally parallel to the turbine combustion gas flow direction F while the rear ridges 172B/174B and grooves 178B are oriented at angle $\alpha_B$ that is approximately equal to that formed between the pressure side of the turbine blade 92 starting at zone B to the blade trailing edge. As with the embodiment of FIG. 12, the horizontal spacer ridges 179 are periodically oriented axially across the entire blade 92 footprint and about the circumference of the abradable component surface 167, in order to block and disrupt blade tip leakage L.

The abradable component 180 embodiment of FIG. 14 is similar to that of FIGS. 12 and 13, with the forward portion ridges 182A/184A and grooves 188A oriented generally parallel to the turbine combustion gas flow direction F while the rear ridges 182B/184B and grooves 188B are selectively oriented at any of angles $\alpha_{B1}$ to $\alpha_{B3}$. Angle $\alpha_{B1}$ is the angle formed between the leading and trailing edges of blade 92. As in FIG. 13, angle $\alpha_{B2}$ is approximately parallel to the portion of the turbine blade 92 high pressure side wall that is in opposed relationship with the aft zone B. As shown in FIG. 14 the rear ridges 182B/184B and grooves 188B are actually oriented at angle $\alpha_{B3}$, which is an angle that is roughly 50% of angle $\alpha_{B2}$. As with the embodiment of FIG. 12, the horizontal spacer ridges 189 are periodically oriented axially across the entire blade 92 footprint and about the circumference of the abradable component surface 187, in order to block and disrupt blade tip leakage L.

In the abradable component 190 embodiment of FIG. 15 the forward ridges 192A/194A and grooves 198A and angle $\alpha_A$ are similar to those of FIG. 14, but the aft ridges 192B/194B and grooves 198B have narrower spacing and widths than FIG. 14. The alternative angle $\alpha_{B1}$ of the aft ridges 192B/194B and grooves 198B shown in FIG. 15 matches the trailing edge angle of the turbine blade 92, as does the angle $\alpha_B$ in FIG. 12. The actual angle $\alpha_{B2}$ is approximately parallel to the portion of the turbine blade 92 high pressure side wall that is in opposed relationship with the aft zone B, as in FIG. 13. The alternative angle $\alpha_{B3}$ and the horizontal spacer ridges 199 match those of FIG. 14, though other arrays of angles or spacer ridges can be utilized.

Figure 16:
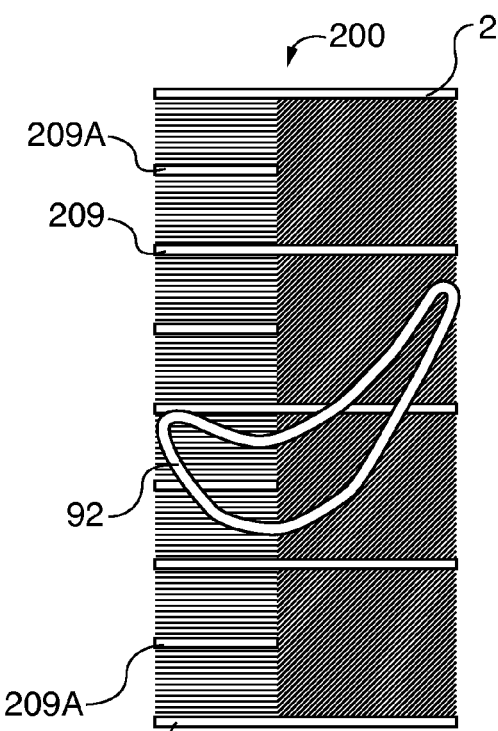
Figure 17:
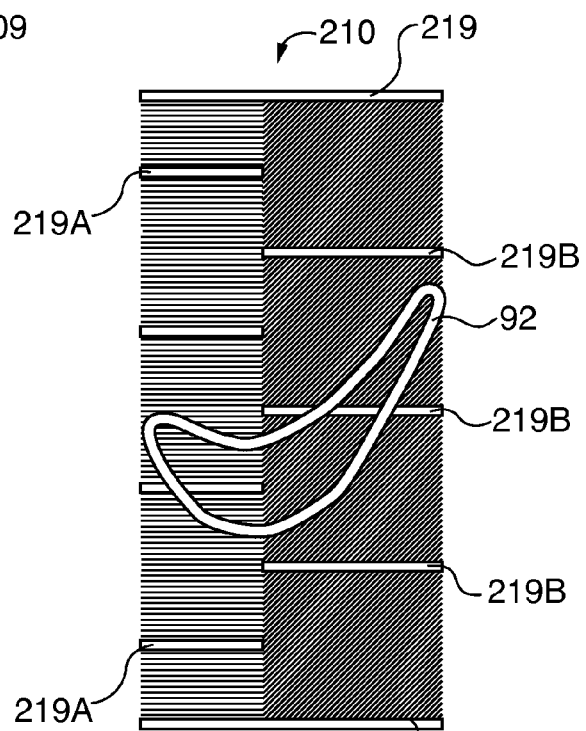

Alternative spacer ridge patterns are shown in FIGS. 16 and 17. In the embodiment of FIG. 16 the abradable component 200 incorporates an array of full-length spacer ridges 209 that span the full axial footprint of the turbine blade 92 and additional forward spacer ridges 209A that are inserted between the full-length ridges. The additional forward spacer ridges 209A provide for additional blockage or blade tip leakage in the blade 92 portion that is proximal the leading edge. In the embodiment of FIG. 17 the abradable component 210 has a pattern of full-length spacer ridges 219 and also circumferentially staggered arrays of forward spacer ridges 219A and aft spacer ridges 219B. The circumferentially staggered ridges 219A/B provide for periodic blocking or disruption of blade tip leakage as the blade 92 sweeps the abradable component 210 surface, without the potential for continuous contact throughout the sweep that might cause premature blade tip wear.

While arrays of horizontal spacer ridges have been previously discussed, other embodiments of the invention include vertical spacer ridges. More particularly the abradable component 220 embodiment of FIGS. 18 and 19 incorporate forward ridges 222A between which are groove 228A. Those grooves are interrupted by staggered forward vertical ridges 223A that interconnect with the forward ridges 222A. The vertical As is shown in FIG. 18 the staggered forward vertical ridges 223A form a series of diagonal arrays sloping downwardly from left to right. A full-length vertical spacer ridge 229 is oriented in a transitional zone T between the forward zone A and the aft zone B. The aft ridges 222B and grooves 228B are angularly oriented, completing the hockey stick-like planform array with the forward ridges 222A and grooves 228A. Staggered rear vertical ridges 223B are arrayed similarly to the forward vertical ridges 223A. The vertical ridges 223A/B and 229 disrupt generally axial airflow leakage across the abradable component 220 grooves from the forward to aft portions that otherwise occur with uninterrupted full-length groove embodiments of FIGS. 12-17, but at the potential disadvantage of increased blade tip wear at each potential rubbing contact point with one of the vertical ridges. Staggered vertical ridges 223A/B as a compromise periodically disrupt axial airflow through the grooves 228A/B without introducing a potential 360 degree rubbing surface for turbine blade tips. Potential 360 degree rubbing surface contact for the continuous vertical ridge 229 can be reduced by shortening that ridge vertical height relative to the ridges 222A/B or 223 A/B, but still providing some axial flow disruptive capability in the transition zone T between the forward grooves 228A and the rear grooves 228B.

FIG. 20 shows a simulated fluid flow comparison between a hockey stick-like ridge/groove pattern array planform with continuous grooves (solid line) and split grooves disrupted by staggered vertical ridges (dotted line). The total blade tip leakage mass flux (area below the respective lines) is lower for the split groove array pattern than for the continuous groove array pattern.

Staggered ridges that disrupt airflow in grooves do not have to be aligned vertically in the direction of blade rotation R. As shown in FIG. 21 the abradable component 230 has patterns of respective forward and aft ridges 232A/B and grooves 238A/B that are interrupted by angled patterns of ridges 233A/B ($\alpha_A$, $\alpha_B$) that connect between successive rows of forward and aft ridges and periodically block downstream flow within the grooves 238 A/B. As with the embodiment of FIG. 18, the abradable component 230 has a continuous vertically aligned ridge 239 located at the transition between the forward zone A and aft zone B. The intersecting angled array of the ridges 232A and 233A/B effectively block localized blade tip leakage L from the high pressure side 96 to the low pressure side 98 along the turbine blade axial length from the leading to trailing edges.

It is noted that the spacer ridge 169, 179, 189, 199, 209, 219, 229, 239, etc., embodiments shown in FIGS. 12-19 and 21 may have different relative heights in the same abradable component array and may differ in height from one or more of the other ridge arrays within the component. For example if the spacer ridge height is less than the height of other ridges in the abradable surface it may never contact a blade tip but can still function to disrupt airflow along the adjoining interrupted groove.

Figure 22:
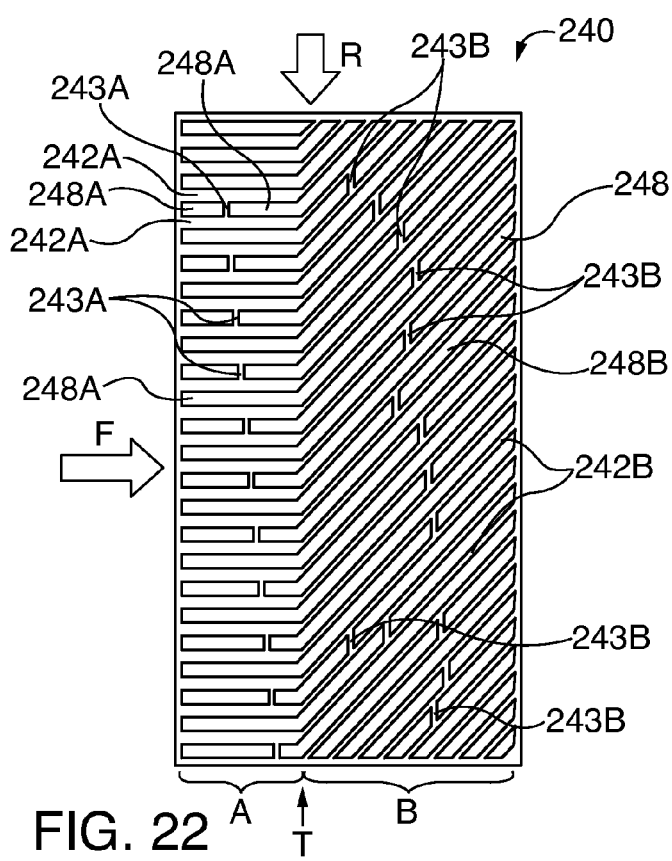
FIG. 22 is a plan or plan form view of another "hockey stick" configuration ridge and groove pattern for an abradable surface, similar to that of FIGS. 18 and 19, which includes vertically oriented ridge arrays that are laterally staggered across the abradable surface in the turbine engine's axial flow direction, in accordance with another exemplary embodiment of the invention.

FIG. 22 is an alternative embodiment of a hockey stick-like planform pattern abradable component 240 that combines the embodiment concepts of distinct forward zone A and aft zone B respective ridge 242 A/B and groove 248A/B patterns which intersect at a transition T without any vertical ridge to split the zones from each other. Thus the grooves 248A/B form a continuous composite groove from the leading or forward edge of the abradable component 240 to its aft most downstream edge (see flow direction F arrow) that is covered by the axial sweep of a corresponding turbine blade. The staggered vertical ridges 243A/B interrupt axial flow through each groove without potential continuous abrasion contact between the abradable surface and a corresponding rotating blade (in the direction of rotation arrow R) at one axial location. However the relatively long runs of continuous straight-line grooves 248A/B, interrupted only periodically by small vertical ridges 243 A/B, provide for ease of manufacture by water jet erosion or other known manufacturing techniques. The abradable component 240 embodiment offers a good subjective design compromise among airflow performance, blade tip wear and manufacturing ease/cost.

Figure 23:
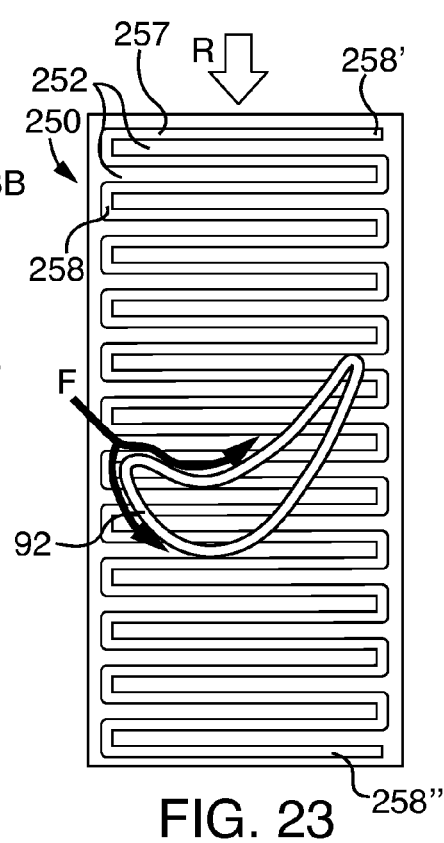
FIG. 23 is a plan or plan form view of a "zig-zag" configuration ridge and groove pattern for an abradable surface, which includes horizontally oriented ridge and groove arrays across the abradable surface in the turbine engine's axial flow direction, in accordance with another exemplary embodiment of the invention.
Figure 30:
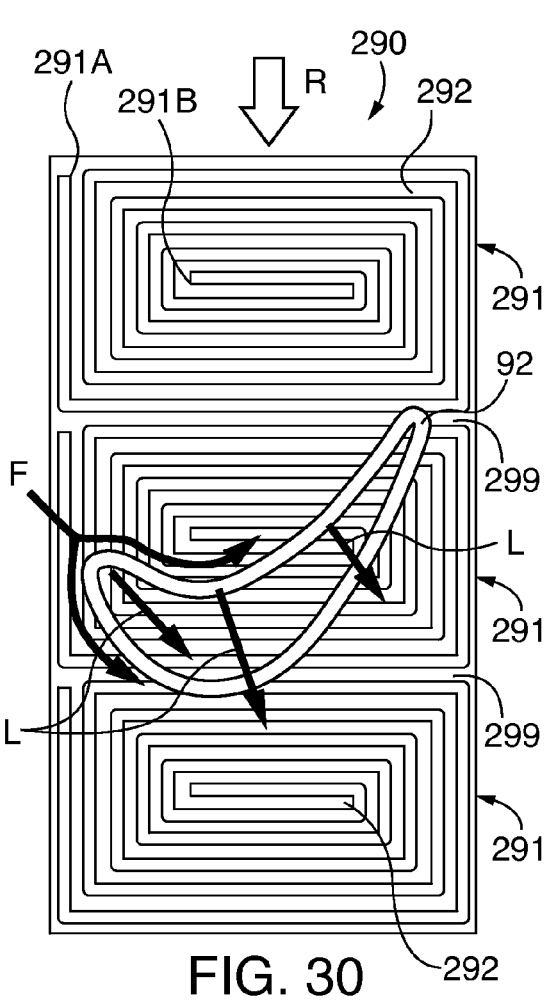
FIGS. 30-33 are plan or plan form views of maze or spiral configuration ridge and groove patterns of turbine engine abradable surfaces, in accordance with exemplary embodiments of the invention, with schematic overlays of turbine blades.
Figure 32:
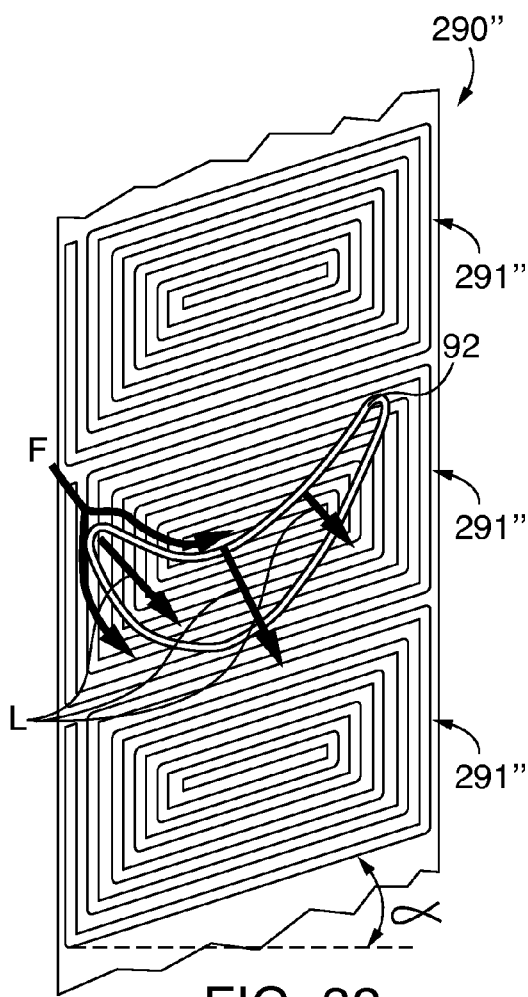

FIGS. 23-25 show embodiments of abradable component ridge and groove planform arrays that comprise zig-zag patterns. The zig-zag patterns are formed by adding one or more layers of material on an abradable surface substrate to form ridges or by forming grooves within the substrate, such as by known laser or water jet cutting methods. In FIG. 23 the abradable component 250 substrate surface 257 has a continuous groove 258 formed therein, starting at 258' and terminating at 258" defines a pattern of alternating finger-like interleaving ridges 252. Other groove and ridge zig-zag patterns may be formed in an abradable component. As shown in the embodiment of FIG. 24 the abradable component 260 has a continuous pattern diagonally oriented groove 268 initiated at 268' and terminating at 268" formed in the substrate surface 267, leaving angular oriented ridges 262. In FIG. 25 the abradable component embodiment 270 has a vee or hockey stick-like dual zone multi groove pattern formed by a pair of grooves 278A and 278B in the substrate surface 277. Groove 278 starts at 278' and terminates at 278". In order to complete the vee or hockey stick-like pattern on the entire substrate surface 277 the second groove 278A is formed in the bottom left hand portion of the abradable component 270, starting at 278A' and terminating at 278A". Respective blade tip leakage L flow-directing front and rear ridges, 272A and 272B, are formed in the respective forward and aft zones of the abradable surface 277, as was done with the abradable embodiments of FIGS. 12-19, 21 and 22. The groove 258, 268, 278 or 278A do not have to be formed continuously and may include blocking ridges like the ridges 223A/B of the embodiment of FIGS. 18 and 19, in order to inhibit gas flow through the entire axial length of the grooves.

FIGS. 26-29 show embodiments of abradable component ridge and groove planform arrays that comprise nested loop patterns. The nested loop patterns are formed by adding one or more layers of material on an abradable surface substrate to form ridges or by forming grooves within the substrate, such as by known laser or water jet cutting methods. The abradable component 280 embodiment of FIG. 26 has an array of vertically oriented nested loop patterns 281 that are separated by horizontally oriented spacer ridges 289. Each loop pattern 281 has nested grooves 288A-288E and corresponding complementary ridges comprising central ridge 282A loop ridges 282 B-282E. In FIG. 27 the abradable component 280' includes a pattern of nested loops 281A in forward zone A and nested loops 281B in the aft zone B. The nested loops 281A and 281B are separated by spacer ridges both horizontally 289 and vertically 289A. In the abradable embodiment 280" of FIG. 28 the horizontal portions of the nested loops 281" are oriented at an angle α. In the abradable embodiment 280''' of FIG. 29 the nested generally horizontal or axial loops 281A''' and 281B''' are arrayed at respective angles $\alpha_A$ and $\alpha_B$ in separate forward zone A and aft zone B arrays. The fore and aft angles and loop dimensions may be varied to minimize blade tip leakage in each of the zones.

Figure 31:
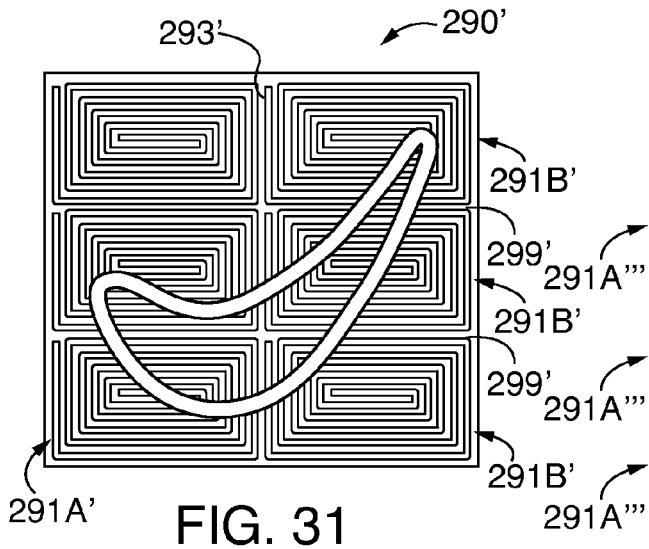
Figure 33:
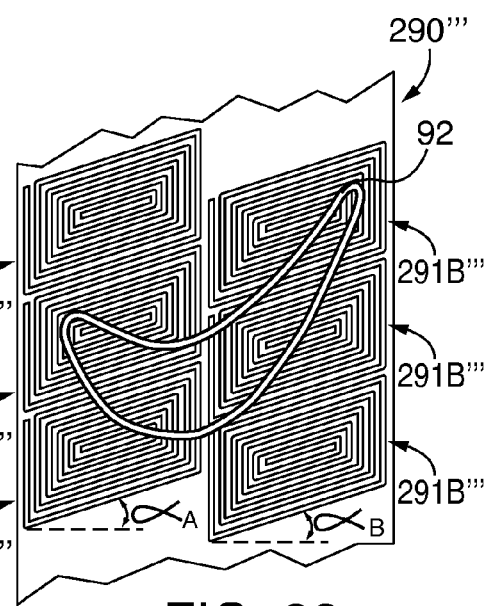

FIGS. 30-33 show embodiments of abradable component ridge and groove planform arrays that comprise spiral maze patterns, similar to the nested loop patterns. The maze patterns are formed by adding one or more layers of material on an abradable surface substrate to form ridges. Alternatively, as shown in these related figures, the maze pattern is created by forming grooves within the substrate, such as by known laser or water jet cutting methods. The abradable component 290 embodiment of FIG. 30 has an array of vertically oriented nested maze patterns 291, each initiating at 291A and terminating at 291B, that are separated by horizontally oriented spacer ridges 299. In FIG. 31 the abradable component 290' includes a pattern of nested mazes 291A in forward zone A and nested mazes 291B in the aft zone B. The nested mazes 291A and 291B are separated by spacer ridges both horizontally 299' and vertically 293'. In the abradable embodiment 290'' of FIG. 32 the horizontal portions of the nested mazes 291'' are oriented at an angle α. In the abradable embodiment 290''' of FIG. 33 the generally horizontal portions of mazes 291A''' and 291B''' are arrayed at respective angles $α_A$ and $α_B$ in separate forward zone A and aft zone B arrays, while the generally vertical portions are aligned with the blade rotational sweep. The fore and aft angles $α_A$ and $α_B$ and maze dimensions may be varied to minimize blade tip leakage in each of the zones.

Figure 34:
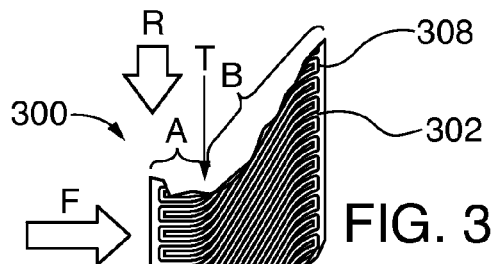
FIGS. 34 and 35 are plan or plan form views of a compound angle with curved rib transitional section configuration ridge and groove pattern for a turbine engine abradable, in accordance with another exemplary embodiment of the invention, and a schematic overlay of a turbine blade.
Figure 35:
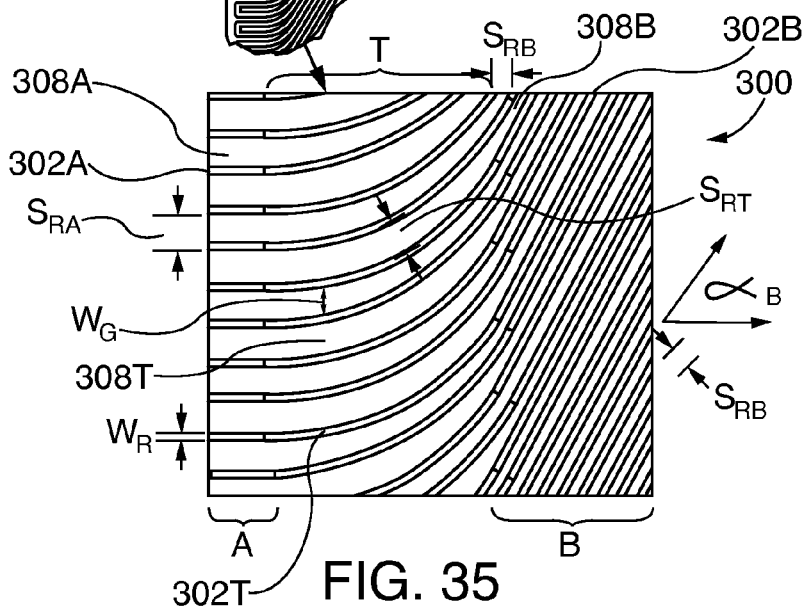
Figure 36:
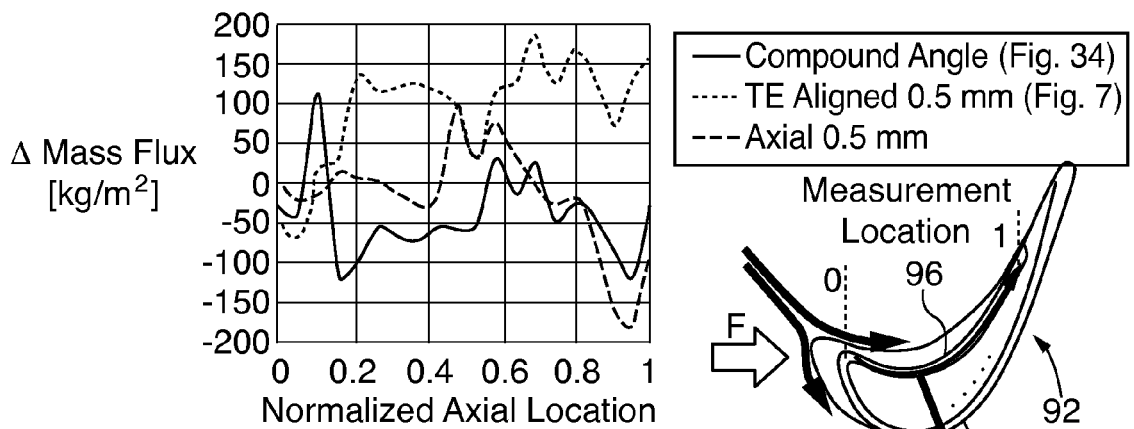
FIG. 36 is a comparison graph of simulated blade tip leakage mass flux from leading to trailing edge for a respective exemplary compound angle with curved rib transitional section configuration ridge and groove pattern abradable surface of the type of FIGS. 34 and 35 of the invention, an exemplary known diagonal ridge and groove pattern of the type shown in FIG. 7, and a known axially aligned ridge and groove pattern abradable surface abradable surface profile.
Figure 37:
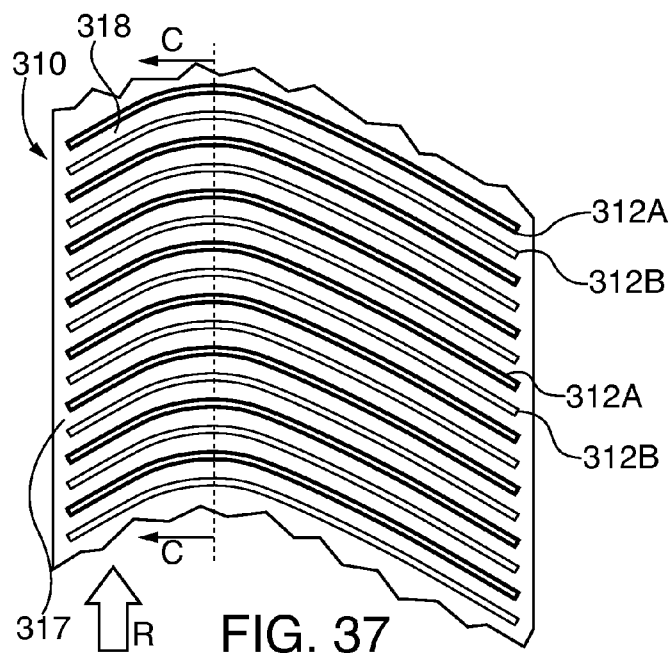
FIG. 37 is a plan or plan form view of a multi height or elevation ridge profile configuration and corresponding groove pattern for an abradable surface, suitable for use in either standard or "fast start" engine modes, in accordance with an exemplary embodiment of the invention.
Figure 38:
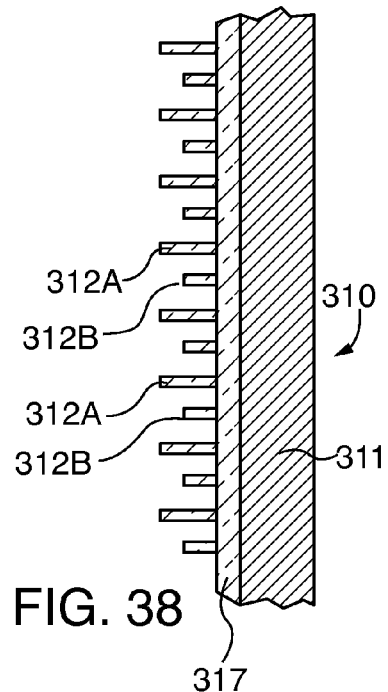
FIG. 38 is a cross sectional view of the abradable surface embodiment of FIG. 37 taken along C-C thereof.
Figure 39:
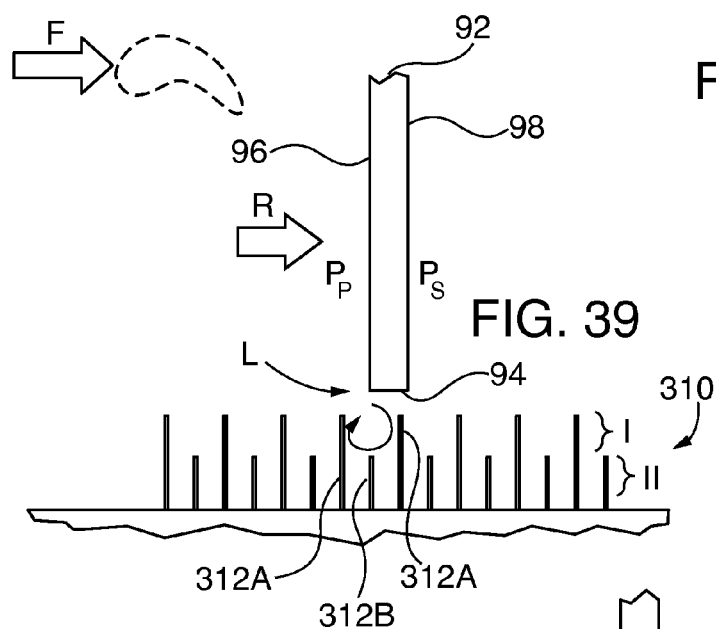
FIG. 39 is a schematic elevational cross sectional view of a moving blade tip and abradable surface embodiment of FIGS. 37 and 38, showing blade tip leakage L and blade tip boundary layer flow in accordance with embodiments of the invention.
Figure 40:
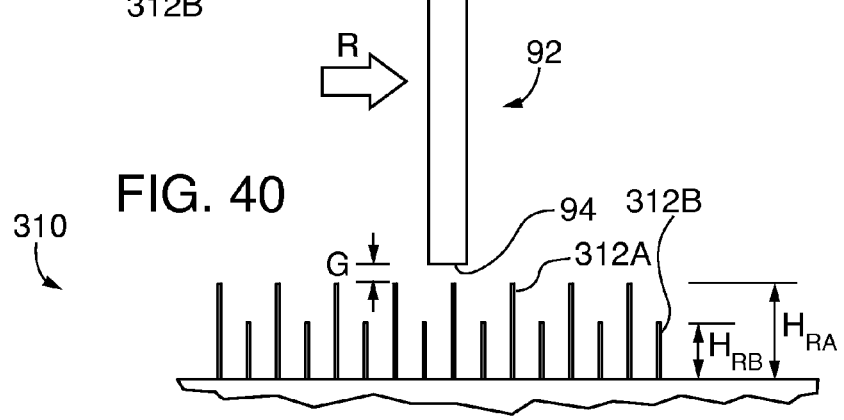
FIGS. 40 and 41 are schematic elevational cross sectional views similar to FIG. 39, showing blade tip gap G, groove and ridge multi height or elevational dimensions in accordance with embodiments of the invention.
Figure 41:
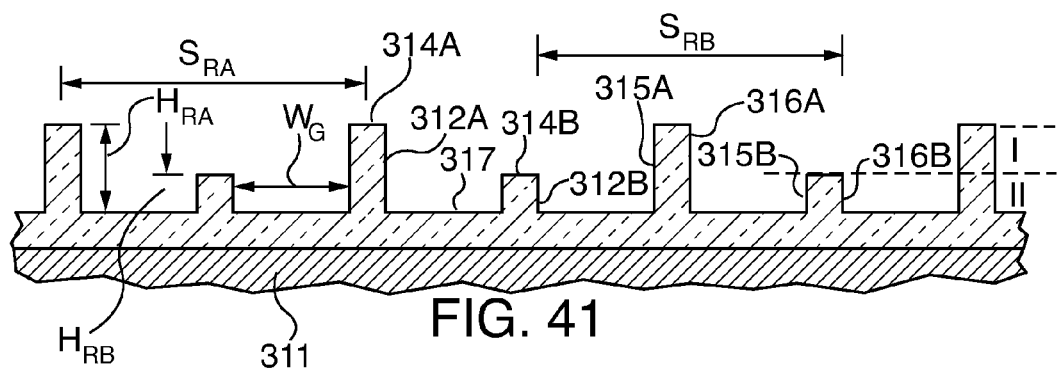

FIGS. 34 and 35 are directed to an abradable component 300 embodiment with separate and distinct multi-arrayed ridge 302A/302B and groove 308A/308B pattern in the respective forward zone A and aft zone B that are joined by a pattern of corresponding curved ridges 302T and grooves 308T in a transition zone T. In this exemplary embodiment pattern the grooves 308A/B/T are formed as closed loops within the abradable component 300 surface, circumscribing the corresponding ribs 302A/B/T. Inter-rib spacing $S_{RA}$, $S_{RB}$ and $S_{RT}$ and corresponding groove spacing may vary axially and vertically across the component surface in order to minimize local blade tip leakage. As will be described in greater detail herein, rib and groove cross sectional profile may be asymmetrical and formed at different angles relative to the abradable component 300 surface in order to reduce localized blade tip leakage. FIG. 36 shows comparative fluid dynamics simulations of comparable depth ridge and groove profiles in abradable components. The solid line represents blade tip leakage in an abradable component of the type of FIGS. 34 and 35. The dashed line represents a prior art type abradable component surface having only axial or horizontally oriented ribs and grooves. The dotted line represents a prior art abradable component similar to that of FIG. 7 with only diagonally oriented ribs and grooves aligned with the trailing edge angle of the corresponding turbine blade 92. The abradable component 300 had less blade tip leakage than the leakage of either of the known prior art type unidirectional abradable surface ridge and groove patterns.

Abradable Surface Ridge and Groove Cross Sectional Profiles

Exemplary invention embodiment abradable surface ridge and groove cross sectional profiles are shown in FIGS. 37 41 and 43 63. Unlike known abradable cross sectional profile patterns that have uniform height across an entire abradable surface, many of the present invention cross sectional profiles formed in the thermally sprayed abradable layer comprise composite multi height/depth ridge and groove patterns that have distinct upper (zone I) and lower (zone II) wear zones. The lower zone II optimizes engine airflow and structural characteristics while the upper zone I minimizes blade tip gap and wear by being more easily abradable than the lower zone. Various embodiments of the abradable component afford easier abradability of the upper zone with upper sub ridges or nibs having smaller cross sectional area than the lower zone rib structure. In some embodiments the upper sub ridges or nibs are formed to bend or otherwise flex in the event of minor blade tip contact and wear down and/or shear off in the event of greater blade tip contact. In other embodiments the upper zone sub ridges or nibs are pixelated into arrays of upper wear zones so that only those nibs in localized contact with one or more blade tips are worn while others outside the localized wear zone remain intact. While upper zone portions of the ridges are worn away they cause less blade tip wear than prior known monolithic ridges and afford greater profile forming flexibility than CMC/FGI abradable component constructions that require profiling around the physical constraints of the composite hollow ceramic sphere matrix orientations and diameters. In embodiments of the invention as the upper zone ridge portion is worn away the remaining lower ridge portion preserves engine efficiency by controlling blade tip leakage. In the event that the localized blade tip gap is further reduced, the blade tips wear away the lower ridge portion at that location. However the relatively higher ridges outside that lower ridge portion localized wear area maintain smaller blade tip gaps to preserve engine performance efficiency.

With the progressive wear zones construction of some embodiments of the invention blade tip gap G can be reduced from previously acceptable known dimensions. For example, if a known acceptable blade gap G design specification is 1 mm the higher ridges in wear zone I can be increased in height so that the blade tip gap is reduced to 0.5 mm. The lower ridges that establish the boundary for wear zone II are set at a height so that their distal tip portions are spaced 1 mm from the blade tip. In this manner a 50% tighter blade tip gap G is established for routine turbine operation, with acceptance of some potential wear caused by blade contact with the upper ridges in zone I. Continued localized progressive blade wearing in zone II will only be initiated if the blade tip encroaches into the lower zone, but in any event the blade tip gap G of 1 mm is no worse than known blade tip gap specifications. In some exemplary embodiments the upper zone I height is approximately ⅓ to ⅔ of the lower zone II height.

The abradable component 310 of FIGS. 37-41 has alternating height curved ridges 312A and 312B that project up from the abradable surface 317 and structurally supported by the support surface 311. Grooves 318 separate the alternating height ridges 312A/B and are defined by the ridge side walls 315A/B and 316A/B. Wear zone I is established from the respective tips 314A of taller ridges 312A down to the respective tips 314B of the lower ridges 312B. Wear zone II is established from the tips 314B down to the substrate surface 317. Under turbine operating conditions (FIGS. 39 and 40) the blade gap G is maintained between the higher ridge tips 312A and the blade tip 94. While the blade gap G is maintained blade leakage L travels in the blade 92 rotational direction (arrow R) from the higher pressurized side of the blade 96 (at pressure $P_P$) to the low or suction pressurized side of the blade 98 (at pressure $P_S$). Blade leakage L under the blade tip 94 is partially trapped between an opposed pair of higher ridges 312A and the intermediate lower ridge 312B, forming a blocking swirling pattern that further resists the blade leakage. If the blade tip gap G becomes reduced for any one or more blades due to turbine casing 100 distortion, fast engine startup mode or other reason initial contact between the blade tip 94 and the abradable component 310 will occur at the higher ridge tips 314A. While still in zone I the blade tips 94 only rub the alternate staggered higher ridges 312A. If the blade gap G progressively becomes smaller, the higher ridges 312A will be abraded until they are worn all the way through zone I and start to contact the lower ridge tips 314B in zone II. Once in Zone II the turbine blade tip 94 rubs all of the remaining ridges 314A/B at the localized wear zone, but in other localized portions of the turbine casing there may be no reduction in the blade tip gap G and the upper ridges 312 A may be intact at their full height. Thus the alternating height rib construction of the abradable component 310 accommodates localized wear within zones I and II, but preserves the blade tip gap G and the aerodynamic control of blade tip leakage L in those localized areas where there is no turbine casing 100 or blade 92 distortion. When either standard or fast start or both engine operation modes are desired the taller ridges 312A form the primary layer of clearance, with the smallest blade tip gap G, providing the best energy efficiency clearance for machines that typically utilize lower ramp rates or that do not perform warm starts. Generally the ridge height $H_{RB}$ for the lower ridge tips 314B is between 25%-75% of the higher ridge tip 314A height, $H_{RA}$. In the embodiment shown in FIG. 41 the centerline spacing $S_{RA}$ between successive higher ridges 312A equals the centerline spacing $S_{RB}$ between successive lower ridges 312B. Other centerline spacing and patterns of multi height ridges, including more than two ridge heights, can be employed.

Figure 42:
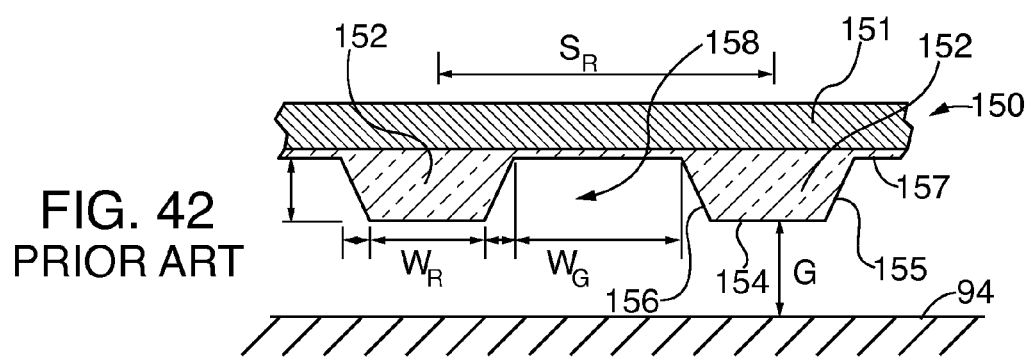
FIG. 42 is an elevational cross sectional view of a known abradable surface ridge and groove profile similar to FIG. 11.
Figure 43:
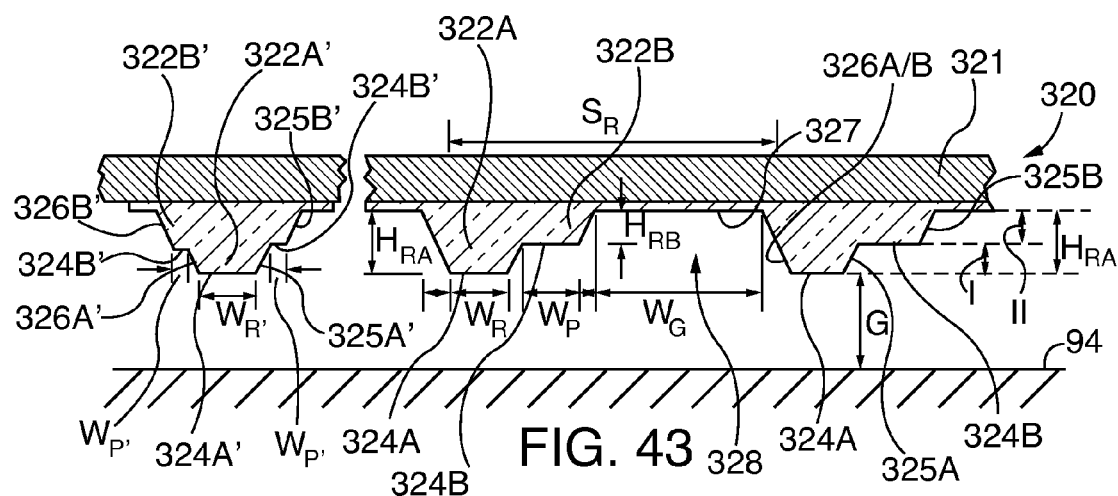
FIG. 43 is an elevational cross sectional view of a multi height or elevation stepped profile ridge configuration and corresponding groove pattern for an abradable surface, in accordance with an embodiment of the invention.
Figure 44:
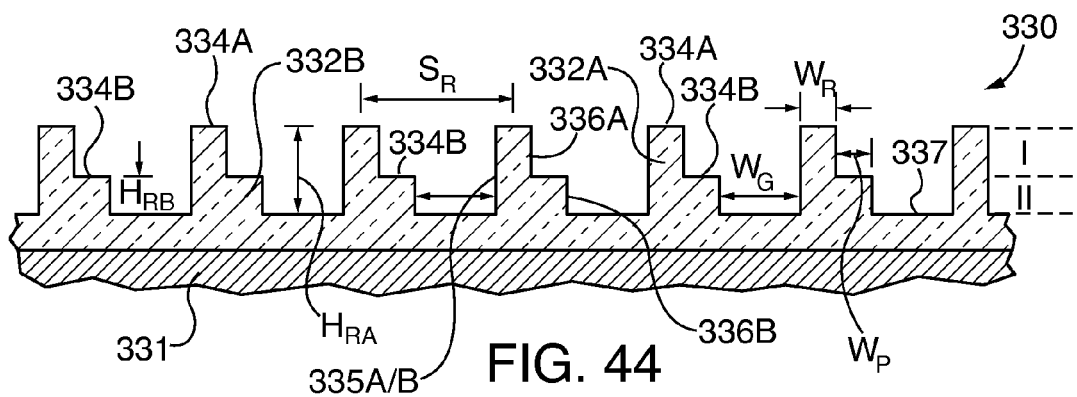
FIG. 44 is an elevational cross sectional view of another embodiment of a multi height or elevation stepped profile ridge configuration and corresponding groove pattern for an abradable surface of the invention.

Other embodiments of ridge and groove profiles with upper and lower wear zones include the stepped ridge profiles of FIGS. 43 and 44, which are compared to the known single height ridge structure of the prior art abradable 150 in FIG. 42. Known single height ridge abradables 150 include a base support 151 that is coupled to a turbine casing 100, a substrate surface 157 and symmetrical ridges 152 having inwardly sloping side walls 155, 156 that terminate in a flat ridge tip 154. The ridge tips 154 have a common height and establish the blade tip gap G with the opposed, spaced blade tip 94. Grooves 158 are established between ridges 152. Ridge spacing $S_R$, groove width $W_G$ and ridge width $W_R$ are selected for a specific application. In comparison, the stepped ridge profiles of FIGS. 43 and 44 employ two distinct upper and lower wear zones on a ridge structure.

The abradable component 320 of FIG. 43 has a support surface 321 and an abradable surface 327 upon which are arrayed distinct two-tier ridges: lower ridge 322B and upper ridge 322A. The lower ridge 322B has a pair of sidewalls 325B and 326B that terminate in plateau 324B of height $H_{RB}$. The upper ridge 322A is formed on and projects from the plateau 324B, having side walls 325A and 326A terminating in a distal ridge tip 324A of height $H_{RA}$ and width $W_R$. The ridge tip 324A establishes the blade tip gap G with an opposed, spaced blade tip 94. Wear zone II extends vertically from the abradable surface 327 to the plateau 324B and wear zone I extends vertically from the plateau 324B to the ridge tip 324A. The two rightmost ridges 322A/B in FIG. 43 have asymmetrical profiles with merged common side walls 326A/B, while the opposite sidewalls 325A and 325B are laterally offset from each other and separated by the plateau 324B of width $W_P$. Grooves 328 are defined between the ridges 322A/B. The leftmost ridge 322A'/B' has a symmetrical profile. The lower ridge 322B' has a pair of converging sidewalls 325B' and 326B', terminating in plateau 324B'. The upper ridge 322A' is centered on the plateau 324B', leaving an equal width offset $W_P'$ with respect to the upper ridge sidewalls 325A' and 326A'. The upper ridge tip 324A' has width $W_R'$. Ridge spacing $S_R$ and groove width $W_G$ are selected to provide desired blade tip leakage airflow control. In some exemplary embodiments of abradable component ridge and groove profiles described herein the groove widths $W_G$ are approximately ⅓-⅔ of lower ridge width. While the ridges and grooves shown in FIG. 43 are symmetrically spaced, other spacing profiles may be chosen, including different ridge cross sectional profiles that create the stepped wear zones I and II.

FIG. 44 shows another stepped profile abradable component 330 with the ridges 332A/B having vertically oriented parallel side walls 335A/B and 336A/B. The lower ridge terminates in ridge plateau 334B, upon which the upper ridge 332A is oriented and terminates in ridge tip 334A. In some applications it may be desirable to employ the vertically oriented sidewalls and flat tips/plateaus that define sharp-cornered profiles, for airflow control in the blade tip gap. The upper wear zone I is between the ridge tip 334A and the ridge plateau 334B and the lower wear zone is between the plateau and the abradable surface 337. As with the abradable embodiment 320 of FIG. 43, while the ridges and grooves shown in FIG. 44 are symmetrically spaced, other spacing profiles may be chosen, including different ridge cross sectional profiles that create the stepped wear zones I and II.

Figure 45:
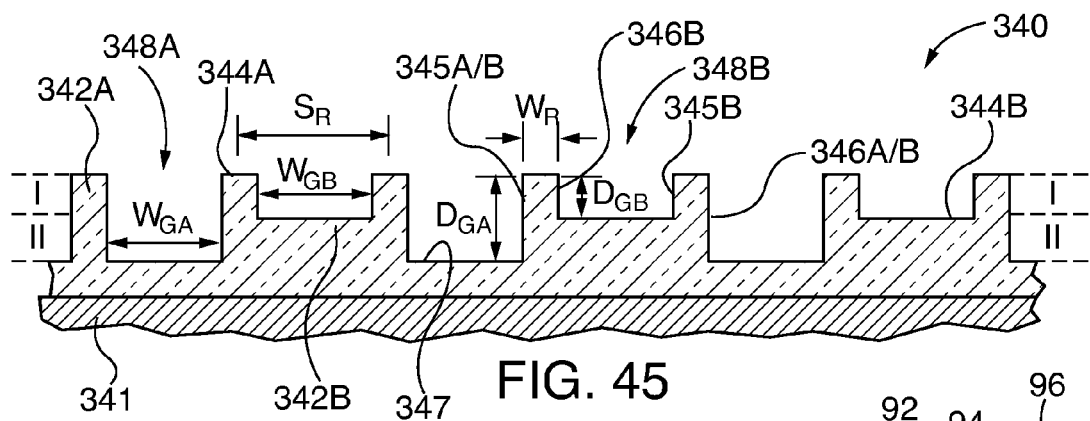
FIG. 45 is an elevational cross sectional view of a multi depth groove profile configuration and corresponding ridge pattern for an abradable surface, in accordance with an embodiment of the invention.

In another permutation or species of stepped ridge construction abradable components, separate upper and lower wear zones I and II also may be created by employing multiple groove depths, groove widths and ridge widths, as employed in the abradable 340 profile shown in FIG. 45. The lower rib 342B has rib plateau 344B that defines wear zone II in conjunction with the abradable surface 347. The rib plateau 344B supports a pair of opposed, laterally flanking upper ribs 342A, which terminate in common height rib tips 344A. The wear zone I is defined between the rib tips 344A and the plateau 344B. A convenient way to form the abradable component 340 profiles is to cut dual depth grooves 348A and 348B into a flat surfaced abradable substrate at respective depths $D_{GA}$ and $D_{GB}$. Ridge spacing $S_R$, groove width $W_{GA/B}$ and ridge tip 344A width $W_R$ are selected to provide desired blade tip leakage airflow control. While the ridges and grooves shown in FIG. 45 are symmetrically spaced, other spacing profiles may be chosen, including different ridge cross sectional profiles that create the stepped wear zones I and II.

Figure 46:
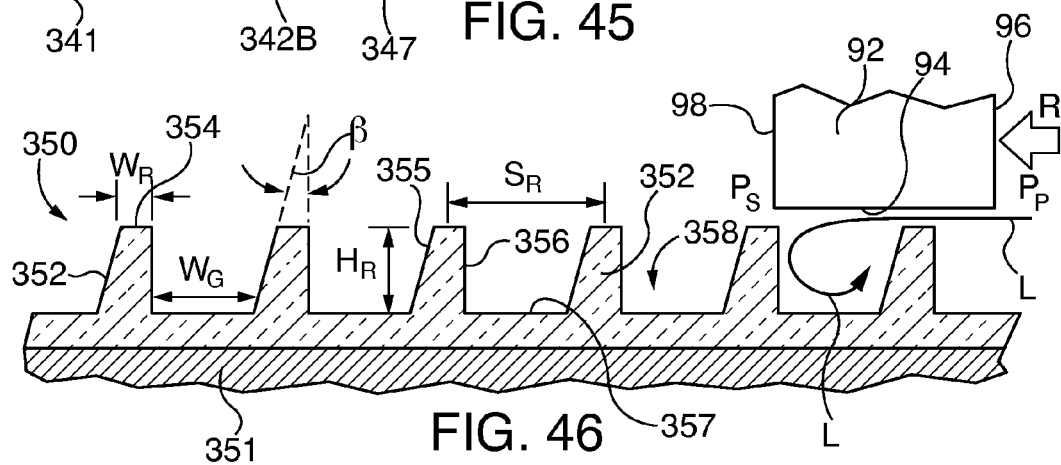
FIG. 46 is an elevational cross sectional view of an asymmetric profile ridge configuration and corresponding groove pattern for an abradable surface, in accordance with an embodiment of the invention.

As shown in FIG. 46, in certain turbine applications it may be desirable to control blade tip leakage by employing an abradable component 350 embodiment having asymmetric profile abradable ridges 352 with vertically oriented, sharp-edged upstream sidewalls 356 and sloping opposite downstream sidewalls 355 extending from the substrate surface 357 and terminating in ridge tips 354. Blade leakage L is initially opposed by the vertical sidewall 356. Some leakage airflow L nonetheless is compressed between the ridge tip 354 and the opposing blade tip 94 while flowing from the high pressure blade side 96 to the lower pressure suction blade side 98 of the blade. That leakage flow follows the downward sloping ridge wall 355, where it is redirected opposite blade rotation direction R by the vertical sidewall 356 of the next downstream ridge. The now counter flowing leakage air L opposes further incoming leakage airflow L in the direction of blade rotation R. Dimensional references shown in FIG. 46 are consistent with the reference descriptions of previously described figures. While the abradable component embodiment 350 of FIG. 46 does not employ the progressive wear zones I and II of other previously described abradable component profiles, such zones may be incorporated in other below-described asymmetric profile rib embodiments.

Figure 47:
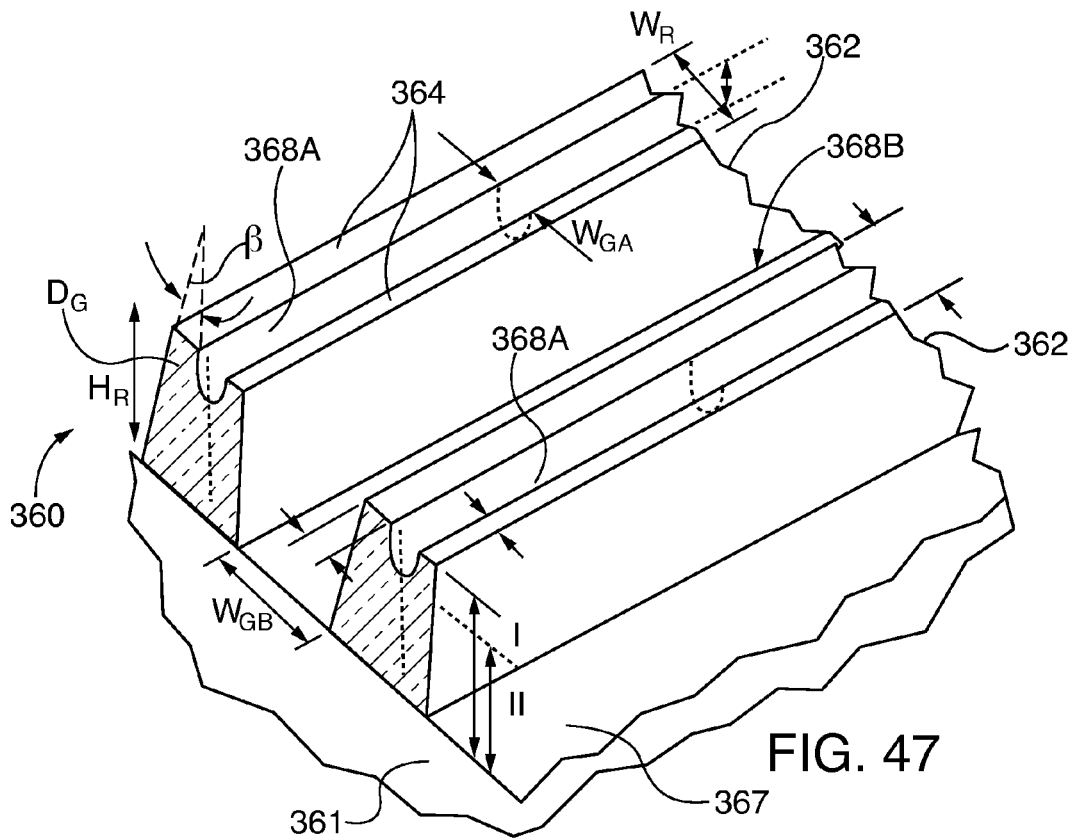
FIG. 47 a perspective view of an asymmetric profile ridge configuration and multi depth parallel groove profile pattern for an abradable surface, in accordance with an embodiment of the invention.

Progressive wear zones can be incorporated in asymmetric ribs or any other rib profile by cutting grooves into the ribs, so that remaining upstanding rib material flanking the groove cut has a smaller horizontal cross sectional area than the remaining underlying rib. Groove orientation and profile may also be tailored to enhance airflow characteristics of the turbine engine by reducing undesirable blade tip leakage, is shown in the embodiment of FIG. 47 to be described subsequently herein. In this manner, the thermally sprayed abradable component surface is constructed with both enhanced airflow characteristics and reduced potential blade tip wear, as the blade tip only contacts portions of the easier to abrade upper wear zone I. The lower wear zone II remains in the lower rib structure below the groove depth. Other exemplary embodiments of abradable component ridge and groove profiles used to form progressive wear zones are now described. Structural features and component dimensional references in these additional embodiments that are common to previously described embodiments are identified with similar series of reference numbers and symbols without further detailed description.

FIG. 47 shows an abradable component 360 having the rib cross sectional profile of the FIG. 46 abradable component 350, but with inclusion of dual level grooves 368A formed in the ridge tips 364 and 368B formed between the ridges 362 to the substrate surface 367. The upper grooves 368A form shallower depth $D_G$ lateral ridges that comprise the wear zone I while the remainder of the ridge 362 below the groove depth comprises the lower wear zone II. In this abradable component embodiment 360 the upper grooves 368A are oriented parallel to the ridge 362 longitudinal axis and are normal to the ridge tip 364 surface, but other groove orientations, profiles and depths may be employed to optimize airflow control and/or minimize blade tip wear.

Figure 48:
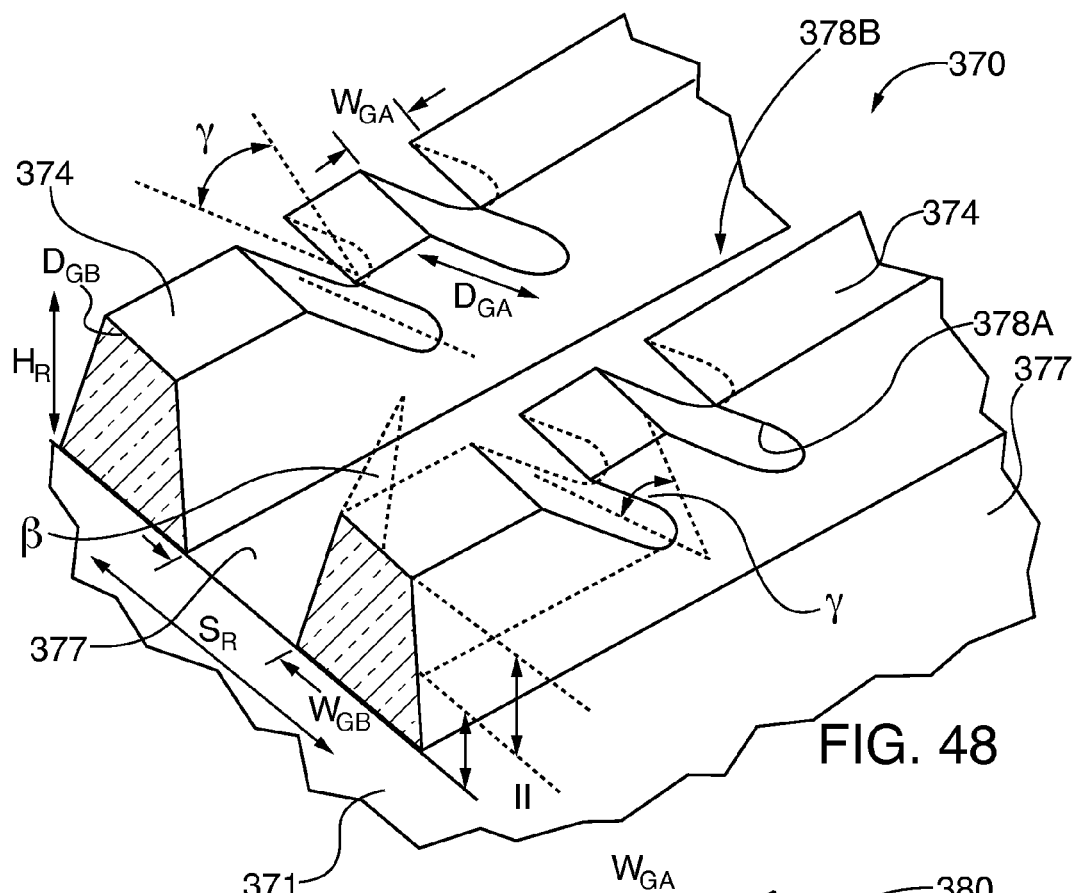
FIG. 48 is a perspective view of an asymmetric profile ridge configuration and multi depth intersecting groove profile pattern for an abradable surface, wherein upper grooves are tipped longitudinally relative to the ridge tip, in accordance with an embodiment of the invention.

In the abradable component 370 embodiment of FIG. 48 a plurality of upper grooves 378A are tilted fore-aft relative to the ridge tip 374 at angle γ, depth $D_{GA}$ and have parallel groove side walls. Upper wear zone I is established between the bottom of the groove 378A and the ridge tip 374 and lower wear zone II is below the upper wear zone down to the substrate surface 377. In the alternative embodiment of FIG. 49 the abradable component 380 has upper grooves 388A with rectangular profiles that are skewed at angle Δ relative to the ridge 382 longitudinal axis and its sidewalls 385/386. The upper groove 388A as shown is also normal to the ridge tip 384 surface. The upper wear zone I is above the groove depth $D_{GA}$ and wear zone II is below that groove depth down to the substrate surface 387. For brevity the remainder of the structural features and dimensions are labelled in FIGS. 48 and 49 with the same conventions as the previously described abradable surface profile embodiments and has the same previously described functions, purposes and relationships.

As shown in FIGS. 50-52, upper grooves do not have to have parallel sidewalls and may be oriented at different angles relative to the ridge tip surface. Also upper grooves may be utilized in ridges having varied cross sectional profiles. The ridges of the abradable component embodiments 390, 400 and 410 have symmetrical sidewalls that converge in a ridge tip. As in previously described embodiments having dual height grooves, the respective upper wear zones I are from the ridge tip to the bottom of the groove depth $D_G$ and the lower wears zones II are from the groove bottom to the substrate surface. In FIG. 50 the upper groove 398A is normal to the substrate surface (ε=90°) and the groove sidewalls diverge at angle Φ. In FIG. 51 the groove 408A is tilted at angle +ε relative to the substrate surface and the groove 418A in FIG. 52 is tilted at −ε relative to the substrate surface. In both of the abradable component embodiments 400 and 410 the upper groove sidewalls diverge at angle Φ. For brevity the remainder of the structural features and dimensions are labelled in FIGS. 50-52 with the same conventions as the previously described abradable surface profile embodiments and has the same previously described functions, purposes and relationships.

In FIGS. 53-56 the abradable ridge embodiments shown have trapezoidal cross sectional profiles and ridge tips with upper grooves in various orientations, for selective airflow control, while also having selective upper and lower wear zones. In FIG. 53 the abradable component 430 embodiment has an array of ridges 432 with asymmetric cross sectional profiles, separated by lower grooves 438B. Each ridge 432 has a first side wall 435 sloping at angle $\beta_1$ and a second side wall 436 sloping at angle $\beta_2$. Each ridge 432 has an upper groove 438A that is parallel to the ridge longitudinal axis and normal to the ridge tip 434. The depth of upper groove 438A defines the lower limit of the upper wear zone I and the remaining height of the ridge 432 defines the lower wear zone II.

In FIGS. 54-56 the respective ridge 422, 442 and 452 cross sections are trapezoidal with parallel side walls 425/445/455 and 426/446/456 that are oriented at angle β. The right side walls 426/446/456 are oriented to lean opposite the blade rotation direction, so that air trapped within an intermediate lower groove 428B/448B/458B between two adjacent ridges is also redirected opposite the blade rotation direction, opposing the blade tip leakage direction from the upstream high pressure side 96 of the turbine blade to the low pressure suction side 98 of the turbine blade, as was shown and described in the asymmetric abradable profile 350 of FIG. 46. Respective upper groove 428A/448A/458A orientation and profile are also altered to direct airflow leakage and to form the upper wear zone I. Groove profiles are selectively altered in a range from parallel sidewalls with no divergence to negative or positive divergence of angle Φ, of varying depths $D_G$ and at varying angular orientations ε with respect to the ridge tip surface. In FIG. 54 the upper groove 428A is oriented normal to the ridge tip 424 surface (ε=90°). In FIGS. 55 and 56 the respective upper grooves 448A and 458A are oriented at angles +/−ε with respect its corresponding ridge tip surface.

Figure 49:
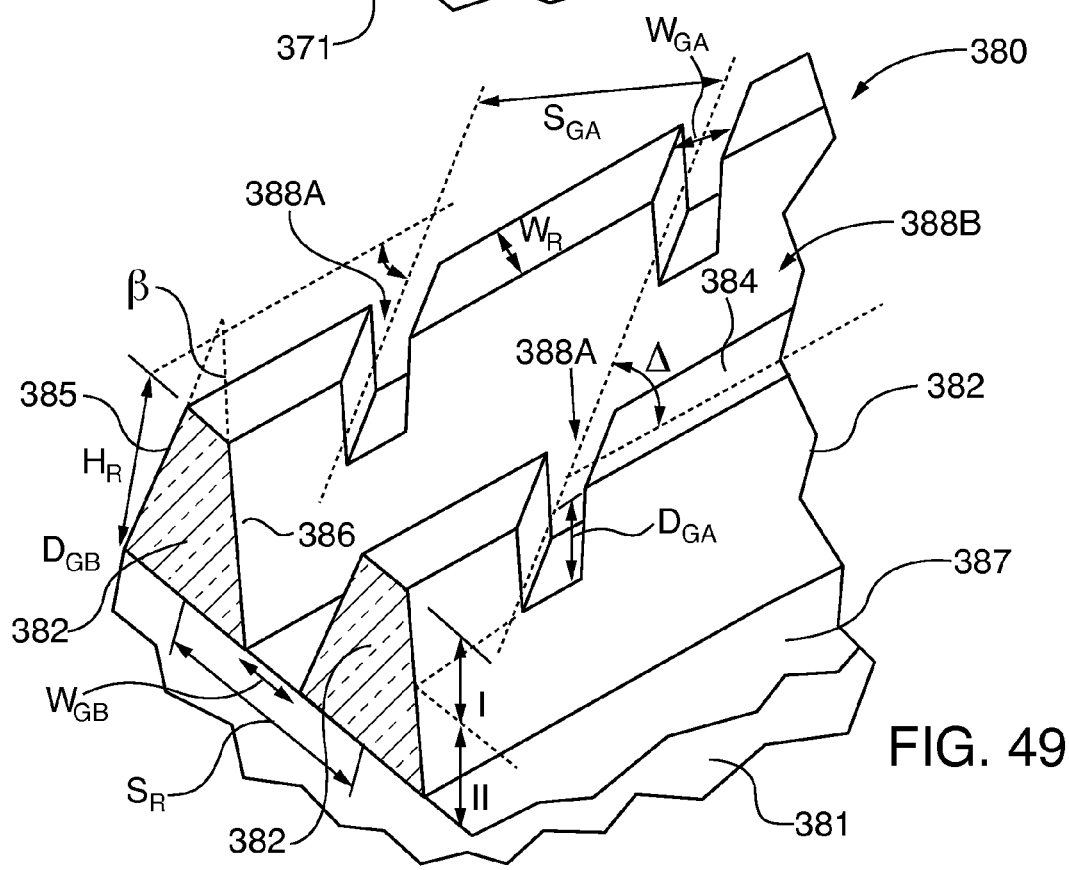
FIG. 49 is a perspective view of another embodiment of the invention, of an asymmetric profile ridge configuration and multi depth intersecting groove profile pattern for an abradable surface, wherein upper grooves are normal to and skewed longitudinally relative to the ridge tip.
Figure 57:
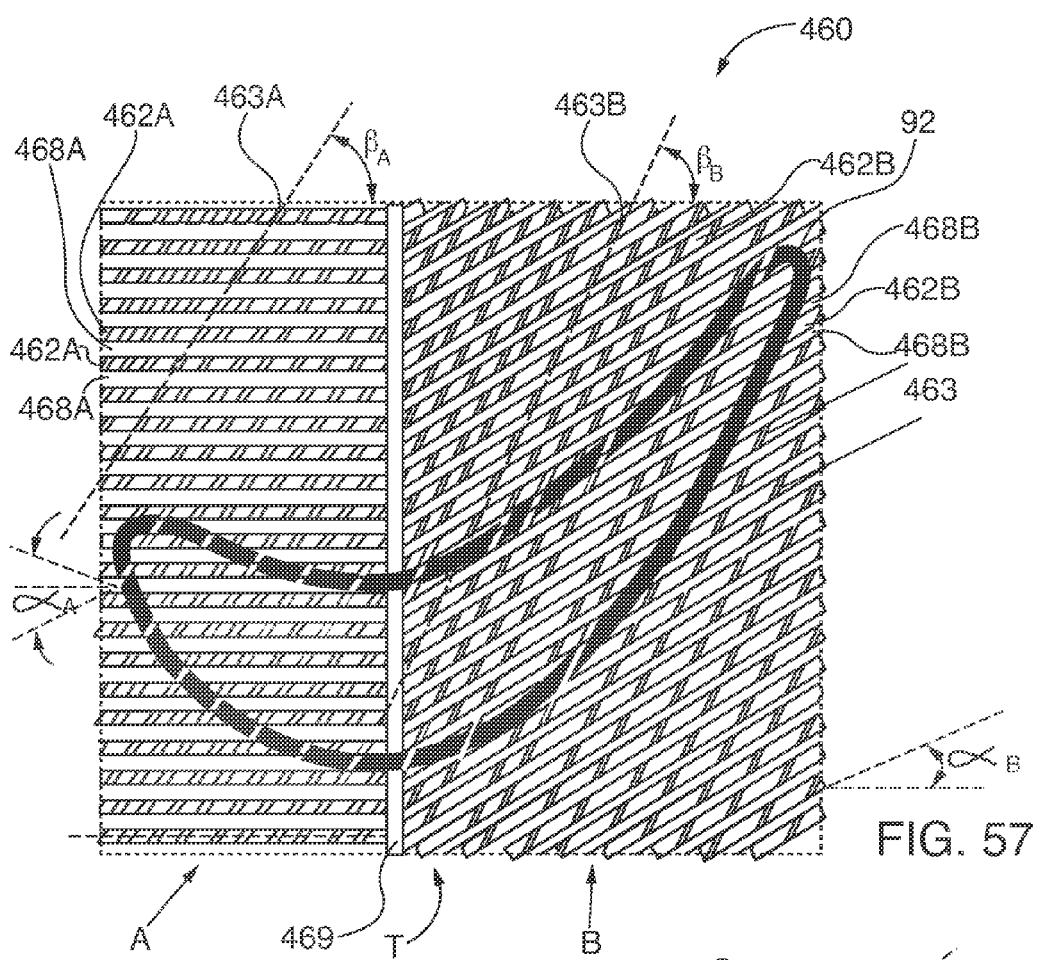
FIG. 57 is a is a plan or plan form view of a multi-level intersecting groove pattern for an abradable surface in accordance with an embodiment of the invention.

FIG. 57 shows an abradable component 460 planform incorporating multi-level grooves and upper/lower wear zones, with forward A and aft B ridges 462A/462B separated by lower grooves 468A/B that are oriented at respective angles $\alpha_{A/B}$. Arrays of fore and aft upper partial depth grooves 463A/B of the type shown in the embodiment of FIG. 49 are formed in the respective arrays of ridges 462A/B and are oriented transverse the ridges and the full depth grooves 468A/B at respective angles $\beta_{A/B}$. The upper partial depth grooves 463A/B define the vertical boundaries of the abradable component 460 upper wear zones I, with the remaining portions of the ridges below those partial depth upper grooves defining the vertical boundaries of the lower wear zones II.

Figure 58:
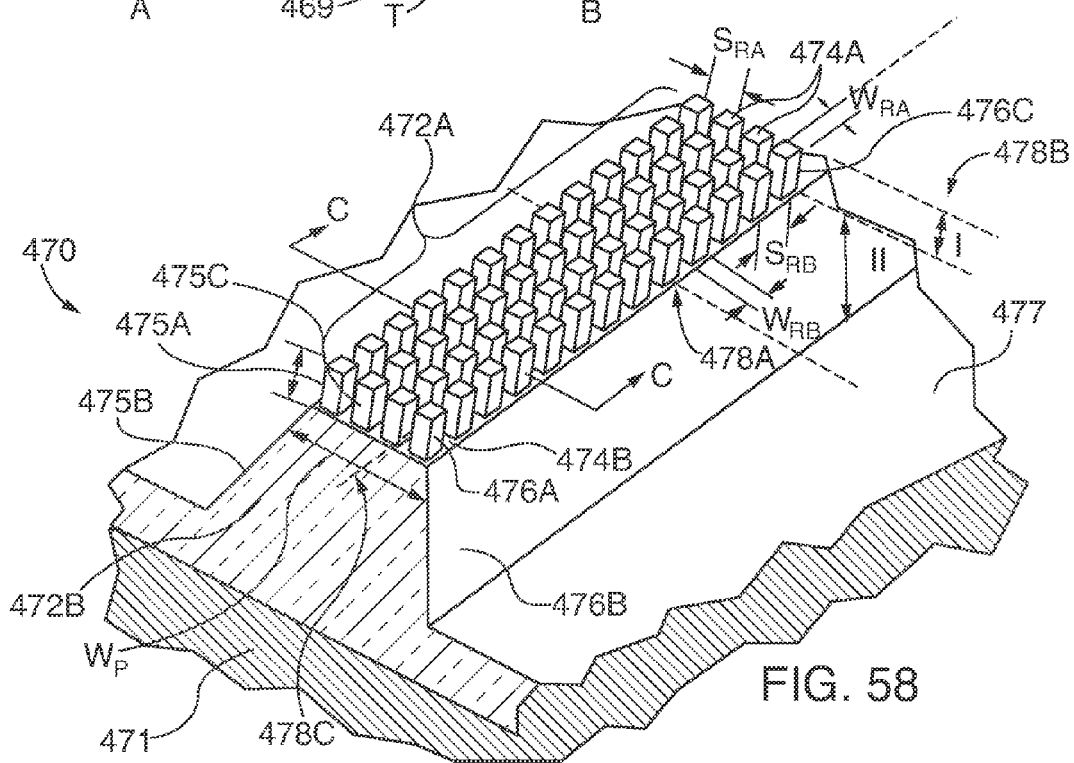
FIG. 58 is a perspective view of a stepped profile abradable surface ridge, wherein the upper level ridge has an array of pixelated upstanding nibs projecting from the lower ridge plateau, in accordance with an embodiment of the invention.

With thermally sprayed abradable component construction, the cross sections and heights of upper wear zone I thermally sprayed abradable material can be configured to conform to different degrees of blade tip intrusion by defining arrays of micro ribs or nibs, as shown in FIG. 58, on top of ridges, without the aforementioned geometric limitations of forming grooves around hollow ceramic spheres in CMC/FGI abradable component constructions, and the design benefits of using a metallic abradable component support structure. The abradable component 470 includes a previously described metallic support surface 471, with arrays of lower grooves and ridges forming a lower wear zone II. Specifically the lower ridge 472B has side walls 475B and 476B that terminate in a ridge plateau 474B. Lower grooves 478B are defined by the ridge side walls 475B and 476B and the substrate surface 477. Micro ribs or nibs 472A are formed on the lower ridge plateau 474B by known additive processes or by forming an array of intersecting grooves 478A and 478C within the lower ridge 472B, without any hollow sphere integrity preservation geometric constraints that would otherwise be imposed in a CMC/FGI abradable component design. In the embodiment of FIG. 58 the nibs 472A have square or other rectangular cross section, defined by upstanding side walls 475A, 475C, 476A and 476C that terminate in ridge tips 474A of common height. Other nib 472A cross sectional planform shapes can be utilized, including by way of example trapezoidal or hexagonal cross sections. Nib arrays including different localized cross sections and heights can also be utilized.

In the alternative embodiment of FIG. 60, distal rib tips 474A' of the upstanding pixelated nib 472A' are constructed of thermally sprayed material 480 having different physical properties and/or compositions than the lower thermally sprayed material 482. For example, the upper distal material 480 can be constructed with easier or less abrasive abrasion properties (e.g., softer or more porous or both) than the lower material 482. In this manner the blade tip gap G can be designed to be less than used in previously known abradable components to reduce blade tip leakage, so that any localized blade intrusion into the material 480 is less likely to wear the blade tips, even though such contact becomes more likely. In this manner the turbine engine can be designed with smaller blade tip gap, increasing its operational efficiency, as well as its ability to be operated in standard or fast start startup mode, while not significantly impacting blade wear.

Nib 472A and groove 478A/C dimensional boundaries are identified in FIGS. 58 and 59, consistent with those described in the prior embodiments. Generally nib 472A height $H_{RA}$ ranges from approximately 20%-100% of the blade tip gap G or from approximately ⅓-⅔ the total ridge height of the lower ridge 472B and the nibs 472A. Nib 472A cross section ranges from approximately 20% to 50% of the nib height $H_{RA}$. Nib material construction and surface density (quantified by centerline spacing $S_{RA/B}$ and groove width $W_{GA}$) are chosen to balance abradable component 470 wear resistance, thermal resistance, structural stability and airflow characteristics. For example, a plurality of small width nibs 472A produced in a controlled density thermally sprayed ceramic abradable offers high leakage protection to hot gas. These can be at high incursion prone areas only or the full engine set. It is suggested that were additional sealing is needed this is done via the increase of plurality of the ridges maintaining their low strength and not by increasing the width of the ridges. Typical nib centerline spacing $S_{RA/B}$ or nib 472A structure and array pattern density selection enables the pixelated nibs to respond in different modes to varying depths of blade tip 94 incursions, as shown in FIGS. 61 63.

In FIG. 61 there is no or actually negative blade tip gap G, as the turbine blade tip 94 is contacting the ridge tips 474A of the pixelated nibs 472A. The blade tip 94 contact intrusion flexes the pixelated nibs 472A. In FIG. 62 there is deeper blade tip intrusion into the abradable component 470, causing the nibs 472A to wear, fracture or shear off the lower rib plateau 474B, leaving a residual blade tip gap there between. In this manner there is minimal blade tip contact with the residual broken nib stubs 472A (if any), while the lower ridge 472B in wear zone II maintains airflow control of blade tip leakage. In FIG. 63 the blade tip 94 has intruded into the lower ridge plateau 474B of the lower rib 472B in wear zone II. Returning to the example of engines capable of startup in either standard or fast start mode, in an alternative embodiment the nibs 472A can be arrayed in alternating height $H_{RA}$ patterns: the higher optimized for standard startup and the lower optimized for fast startup. In fast startup mode the higher of the alternating nibs 472A fracture, leaving the lower of the alternating nibs for maintenance of blade tip gap G.

Exemplary thermally sprayed abradable components having frangible ribs or nibs have height $H_{RA}$ to width $W_{RA}$ ratio of greater than 1 Typically the width $W_{RA}$ measured at the peak of the ridge or nib would be 0.5-2 mm and its height $H_{RA}$ is determined by the engine incursion needs and maintain a height to width ratio ($H_{RA}/W_{RA}$) greater than 1. It is suggested that where additional sealing is needed, this is done via the increase of plurality of the ridges or nibs (i.e., a larger distribution density, of narrow width nibs or ridges, maintaining their low strength) and not by increasing their width $W_{RA}$. For zones in the engine that require the low speed abradable systems the ratio of ridge or nib widths to groove width ($W_{RA}/W_{GA}$) is preferably less than 1. For engine abradable component surface zones or areas that are not typically in need of easy blade tip abradability, the abradable surface cross sectional profile is preferably maximized for aerodynamic sealing capability (e.g., small blade tip gap G and minimized blade tip leakage by applying the surface planform and cross sectional profile embodiments of the invention, with the ridge/nib to groove width ratio of greater than 1.

Figure 6:
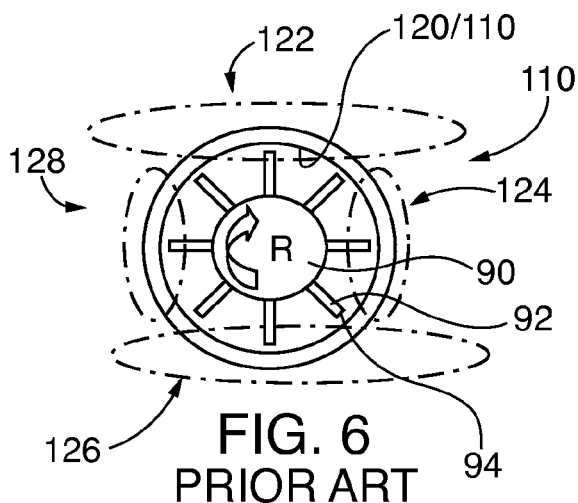
FIG. 6 is a radial cross sectional schematic view of a known turbine engine, highlighting circumferential zones that are more likely to create blade tip wear and zones that are less likely to create blade tip wear.

Multiple modes of blade depth intrusion into the circumferential abradable surface may occur in any turbine engine at different locations. Therefore, the abradable surface construction at any localized circumferential position may be varied selectively to compensate for likely degrees of blade intrusion. For example, referring back to the typical known circumferential wear zone patterns of gas turbine engines 80 in FIGS. 3-6, the blade tip gap G at the 3:00 and 6:00 positions may be smaller than those wear patterns of the 12:00 and 9:00 circumferential positions. Anticipating greater wear at the 12:00 and 6:00 positions the lower ridge height $H_{RB}$ can be selected to establish a worst-case minimal blade tip gap G and the pixelated or other upper wear zone I ridge structure height $H_{RA}$, cross sectional width, and nib spacing density can be chosen to establish a small "best case" blade tip gap G in other circumferential positions about the turbine casing where there is less or minimal likelihood abradable component and case distortion that might cause the blade tip 94 to intrude into the abradable surface layer. Using the frangible ridges 472A of FIG. 62 as an example, during severe engine operating conditions (e.g. when the engine is in fast start startup mode) the blade 94 impacts the frangible ridges 472A or 472A'—the ridges fracture under the high load increasing clearance at the impact zones only—limiting the blade tip wear at non optimal abradable conditions. Generally, the upper wear zone I ridge height in the abradable component can be chosen so that the ideal blade tip gap is 0.25 mm. The 3:00 and 9:00 turbine casing circumferential wear zones (e.g., 124 and 128 of FIG. 6) are likely to maintain the desired 0.25 mm blade tip gap throughout the engine operational cycles, but there is greater likelihood of turbine casing/abradable component distortion at other circumferential positions. The lower ridge height may be selected to set its ridge tip at an idealized blade tip gap of 1.0 mm so that in the higher wear zones the blade tip only wears deeper into the wear zone I and never contacts the lower ridge tip that sets the boundary for the lower wear zone II. If despite best calculations the blade tip continues to wear into the wear zone II, the resultant blade tip wear operational conditions are no worse than in previously known abradable layer constructions. However in the remainder of the localized circumferential positions about the abradable layer the turbine is successfully operating with a lower blade tip gap G and thus at higher operational efficiency, with little or no adverse increased wear on the blade tips.

Advantages of Various Embodiments

Different embodiments of turbine abradable components have been described herein. Many embodiments have distinct forward and aft planform ridge and groove arrays for localized blade tip leakage and other airflow control across the axial span of a rotating turbine blade. Many of the embodiment ridge and groove patterns and arrays are constructed with easy to manufacture straight line segments, sometimes with curved transitional portions between the fore and aft zones. Many embodiments establish progressive vertical wear zones on the ridge structures, so that an established upper zone is easier to abrade than the lower wear zone. The relatively easier to abrade upper zone reduces risk of blade tip wear but establishes and preserves desired small blade tip gaps. The lower wear zone focuses on airflow control, thermal wear and relatively lower thermal abrasion. In many embodiments the localized airflow control and multiple vertical wear zones both are incorporated into the abradable component.

Although various embodiments that incorporate the teachings of the invention have been shown and described in detail herein, those skilled in the art can readily devise many other varied embodiments that still incorporate these teachings. The invention is not limited in its application to the exemplary embodiment details of construction and the arrangement of components set forth in the description or illustrated in the drawings. The invention is capable of other embodiments and of being practiced or of being carried out in various ways. For example, various ridge and groove profiles may be incorporated in different planform arrays that also may be locally varied about a circumference of a particular engine application. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass direct and indirect mountings, connections, supports, and couplings. Further, "connected" and "coupled" are not restricted to physical or mechanical connections or couplings.

What is claimed is:

1. A turbine abradable component, comprising:
a support surface for coupling to a turbine casing;
an abradable substrate coupled to the support surface having a substrate surface adapted for opposed, spaced orientation proximal a rotating turbine blade tip circumferential swept path;
alternating rows of opposed, continuous elongated first and second ridges spanning at least sixty percent of and projecting from the substrate surface, the first ridges having a first ridge height greater than a second ridge height of the second ridges; and
a plurality of third ridges oriented transverse to and coupled to at least one pair of opposed first and second ridges, the third ridges skipping at least one row of alternating first and second ridges and staggered laterally across the abradable surface.

2. The component of claim 1, further comprising identical first ridges and identical second ridges.

3. The component of claim 1, further comprising identical first ridge spacing and identical second ridge spacing.

4. The component of claim 1, further comprising identical first and second ridge spacing.

5. The component of claim 1, further comprising parallel first and second ridge spacing.

6. The component of claim 1, the ridges having symmetrical or asymmetrical cross sections.

7. The component of claim 1, at least some of the ridges having curved planforms.

8. The component of claim 1, the first ridge height between approximately ⅓ to ⅔ higher than the second ridge height.

9. A method for reducing turbine engine blade tip wear in a turbine having a turbine housing, a rotor having blades rotatively mounted in the turbine housing, distal tips of which forming a blade tip circumferential swept path in the blade rotation direction and axially with respect to the turbine housing, the method comprising;
inserting a generally arcuate shaped abradable component in the housing in opposed, spaced relationship with the blade tips, defining a blade gap there between, the abradable component having:
a support surface for coupling to the turbine casing;
an abradable substrate coupled to the support surface having a substrate surface adapted for orientation proximal a rotating turbine blade tip circumferential swept path;
alternating rows of opposed, continuous elongated first and second ridges spanning at least sixty percent of and projecting from the substrate surface, the first ridges having a first ridge height greater than second height of the second ridges;
operating the turbine engine so that upon any contact between the blade tips and the abradable surface initially abrades only higher first ridges tips while remaining non abraded first ridges and the second ridges inhibit blade tip gas flow between the blade tips and substrate surface; and
operating the turbine engine such that upon any subsequent contact between the blade tips and the abradable surface abrades remaining portions of the first ridges or the second ridges.

10. The method of claim 9, the first ridges adapted for orientation upstream a turbine blade rotation direction to resist blade tip airflow leakage from a turbine blade higher pressure side to a lower pressure side through a blade tip gap and the second ridges adapted for redirecting the airflow leakage downstream the first ridges to resist further blade tip airflow.

11. The method of claim 10, the abradable component further comprising a plurality of third ridges oriented transverse to and coupled to at least one pair of opposed first and second ridges, the third ridges adapted for inhibiting blade tip airflow leakage between the first and second ridges.

12. The method of claim 9, further comprising operating the turbine engine in either standard or fast start modes, so that:
any contact between the blade tips and the abradable surface in standard start mode only abrades the first ridges; and
any contact between the blade tips and the abradable surface in fast start mode abrades the first ridges and subsequently abrades at least one of the second ridges.

13. The method of claim 12, further comprising providing a thermally sprayed ceramic/metallic substrate coupled to the support surface.

14. A turbine engine, comprising:
a turbine housing;
a rotor having blades rotatively mounted in the turbine housing, distal tips of which forming a blade tip circumferential swept path in the blade rotation direction and axially with respect to the turbine housing; and
an abradable component having:
a support surface for coupling to a turbine casing;

an abradable substrate coupled to the support surface, having a substrate surface adapted for opposed, spaced orientation proximal a rotating turbine blade tip circumferential swept path; and alternating rows of opposed, continuous elongated first and second ridges spanning at least sixty percent of and projecting from the substrate surface, the first ridges having a first ridge height greater than second ridge height of the second ridges;

wherein the first ridge height is selected such that a first travel of the distal tips into a path of the abradable surface results in abrading of the first ridges only; and wherein the second ridge height is selected such that a subsequent travel of the distal tips into a path of the abradable surface results abrades any remaining first ridges, if present, and subsequently abrades at least one of the second ridges.

15. The engine of claim 14, the abradable component first ridge height approximately ⅓ to ⅔ higher than the second ridge height.

16. The engine of claim 14, the abradable component further comprising a plurality of third ridges oriented transverse to and coupled to at least one pair of opposed first and second ridges.

17. The engine of claim 16 capable of starting in both standard and fast start modes without modifying the turbine blade tip gap, so that:

any contact between the blade tips and the abradable surface in standard start mode only abrades the first ridges; and any contact between the blade tips and the abradable surface in fast start mode abrades the first ridges and subsequently abrades at least one of the second ridges.

18. The engine of claim 14 capable of starting in both standard and fast start modes without modifying the turbine blade tip gap, so that:

any contact between the blade tips and the abradable surface in standard start mode only abrades the first ridges; and any contact between the blade tips and the abradable surface in fast start mode abrades the first ridges and subsequently abrades at least one of the second ridges.

19. The component of claim 1, wherein first ridges and second ridges individually comprise a plurality of wear zones of different heights.

* * * * *